US009997354B2

(12) United States Patent
Orihashi et al.

(10) Patent No.: US 9,997,354 B2
(45) Date of Patent: *Jun. 12, 2018

(54) METHOD OF MANUFACTURING SEMICONDUCTOR DEVICE, SUBSTRATE PROCESSING APPARATUS, AND RECORDING MEDIUM

(71) Applicant: HITACHI KOKUSAI ELECTRIC INC., Tokyo (JP)

(72) Inventors: Yugo Orihashi, Toyama (JP); Kazuhiro Yuasa, Toyama (JP); Atsushi Moriya, Toyama (JP); Naoharu Nakaiso, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/448,519

(22) Filed: Mar. 2, 2017

(65) Prior Publication Data

US 2017/0263441 A1    Sep. 14, 2017

(30) Foreign Application Priority Data

Mar. 9, 2016 (JP) ................................. 2016-045713

(51) Int. Cl.
 *H01L 21/02* (2006.01)
 *C23C 16/24* (2006.01)
 (Continued)

(52) U.S. Cl.
 CPC .......... *H01L 21/0259* (2013.01); *C23C 16/24* (2013.01); *C23C 16/4408* (2013.01); *C23C 16/45544* (2013.01); *C23C 16/52* (2013.01);

*H01L 21/0242* (2013.01); *H01L 21/0262* (2013.01); *H01L 21/02381* (2013.01); (Continued)

(58) Field of Classification Search
 CPC ......... H01L 21/02211; H01L 21/02164; H01L 21/0217; C23C 16/52; C23C 16/45546; C23C 16/24

See application file for complete search history.

(56) References Cited

U.S. PATENT DOCUMENTS

2003/0034251 A1* 2/2003 Chikarmane ....... C23C 18/1632
                                                    205/125
2004/0224475 A1* 11/2004 Lee .................... C23C 16/0281
                                                    438/399

(Continued)

FOREIGN PATENT DOCUMENTS

JP   2013-197307 A    9/2013
JP   2014-060227 A    4/2014

(Continued)

Primary Examiner — Dung Le
(74) Attorney, Agent, or Firm — Volpe and Koenig, P.C.

(57) ABSTRACT

There is provided a method of manufacturing a semiconductor device, including forming a seed layer on a substrate by performing a cycle a predetermined number of times, the cycle including supplying a halogen-based first processing gas to the substrate; supplying a non-halogen-based second processing gas to the substrate; and supplying a hydrogen-containing gas to the substrate. Further, the method further includes forming a film on the seed layer by supplying a third processing gas to the substrate.

14 Claims, 12 Drawing Sheets

(51) Int. Cl.
  *C23C 16/44* (2006.01)
  *C23C 16/455* (2006.01)
  *C23C 16/52* (2006.01)
  *H01L 27/108* (2006.01)
  *H01L 27/11582* (2017.01)

(52) U.S. Cl.
  CPC .. *H01L 21/02532* (2013.01); *H01L 21/02645* (2013.01); *H01L 27/10855* (2013.01); *H01L 27/11582* (2013.01); *H01L 21/02592* (2013.01); *H01L 21/02595* (2013.01); *H01L 21/02598* (2013.01)

(56) References Cited

U.S. PATENT DOCUMENTS

| | | |
|---|---|---|
| 2013/0149846 A1 | 6/2013 | Koshi et al. |
| 2014/0080321 A1 | 3/2014 | Hirose et al. |
| 2017/0186604 A1* | 6/2017 | Orihashi ........... H01L 21/02211 |

FOREIGN PATENT DOCUMENTS

| | | |
|---|---|---|
| JP | 2014-067796 A | 4/2014 |
| WO | 2012/029661 A1 | 3/2012 |

\* cited by examiner

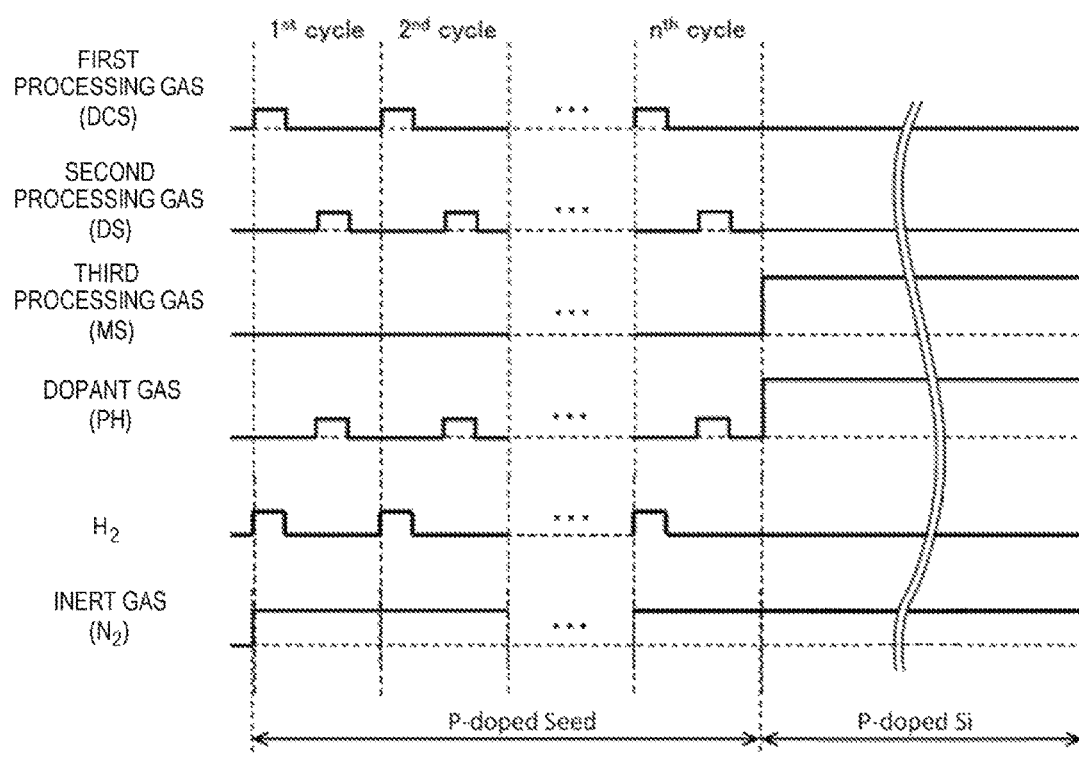

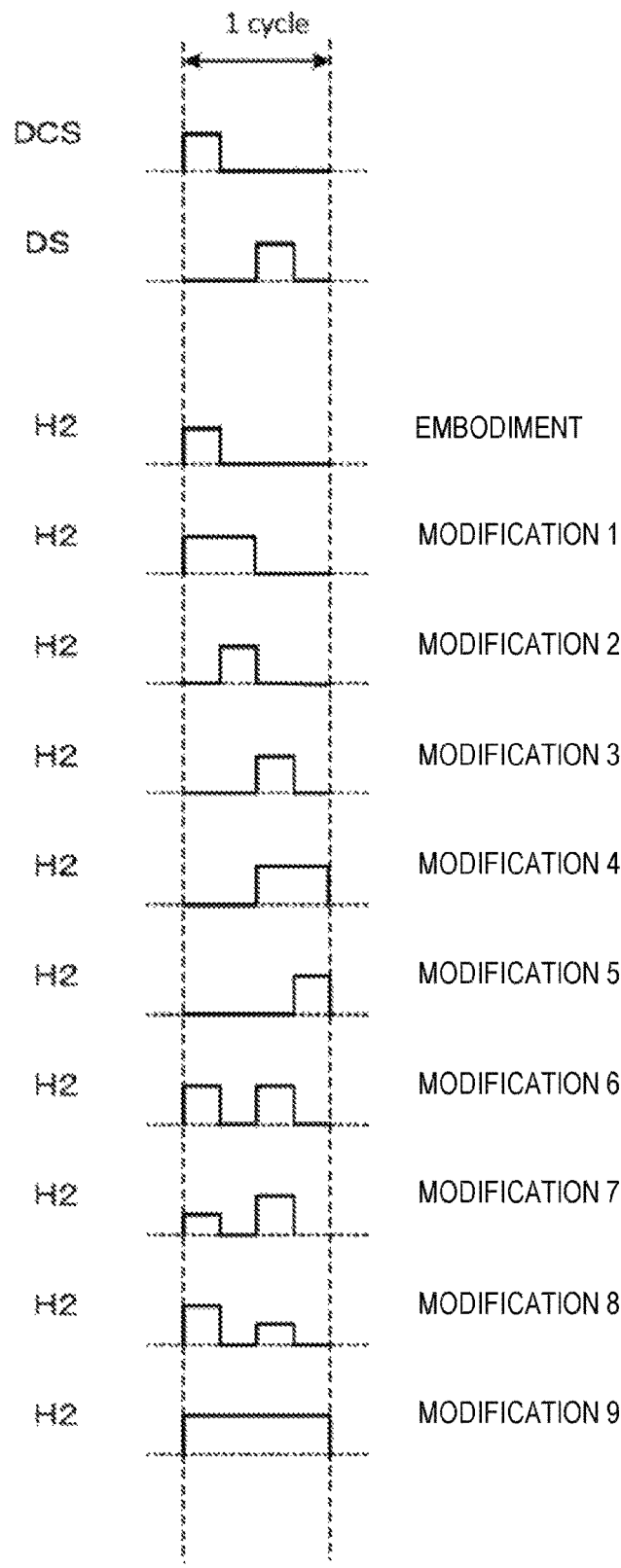

METHOD OF MANUFACTURING SEMICONDUCTOR DEVICE, SUBSTRATE PROCESSING APPARATUS, AND RECORDING MEDIUM

CROSS-REFERENCE TO RELATED APPLICATION(S)

This application is based upon and claims the benefit of priority from Japanese Patent Application No. 2016-045713, filed on Mar. 9, 2016, the entire contents of which are incorporated herein by reference.

TECHNICAL FIELD

The present disclosure relates to a method of manufacturing a semiconductor device, a substrate processing apparatus, and a recording medium.

BACKGROUND

As one of processes of manufacturing a semiconductor device, a process of forming a film, which contains a predetermined element such as silicon (Si) as a main element, on a substrate has been performed by using a halogen-based processing gas or a non-halogen-based processing gas.

SUMMARY

The present disclosure provides some embodiments of a technique capable of improving the film quality of a film formed on a substrate.

According to one embodiment of the present disclosure, there is provided a technique of manufacturing a semiconductor device, including forming a seed layer on a substrate by performing a cycle a predetermined number of times, the cycle including supplying a halogen-based first processing gas to the substrate; supplying a non-halogen-based second processing gas to the substrate; and supplying a hydrogen-containing gas to the substrate, and forming a film on the seed layer by supplying a third processing gas to the substrate.

BRIEF DESCRIPTION OF THE DRAWINGS

FIG. 4 is a diagram illustrating a film forming sequence according to one embodiment of the present disclosure.

FIG. 5 is a diagram illustrating a modification of the film forming sequence according to one embodiment of the present disclosure, in which supply timings of a DCS gas, a DS gas, and a $H_2$ gas in one cycle of the film forming sequence are extracted.

DETAILED DESCRIPTION

One Embodiment of the Present Disclosure

One embodiment of the present disclosure will now be described with reference to FIGS. 1 to 3.

(1) Configuration of Substrate Processing Apparatus

Figure 1:
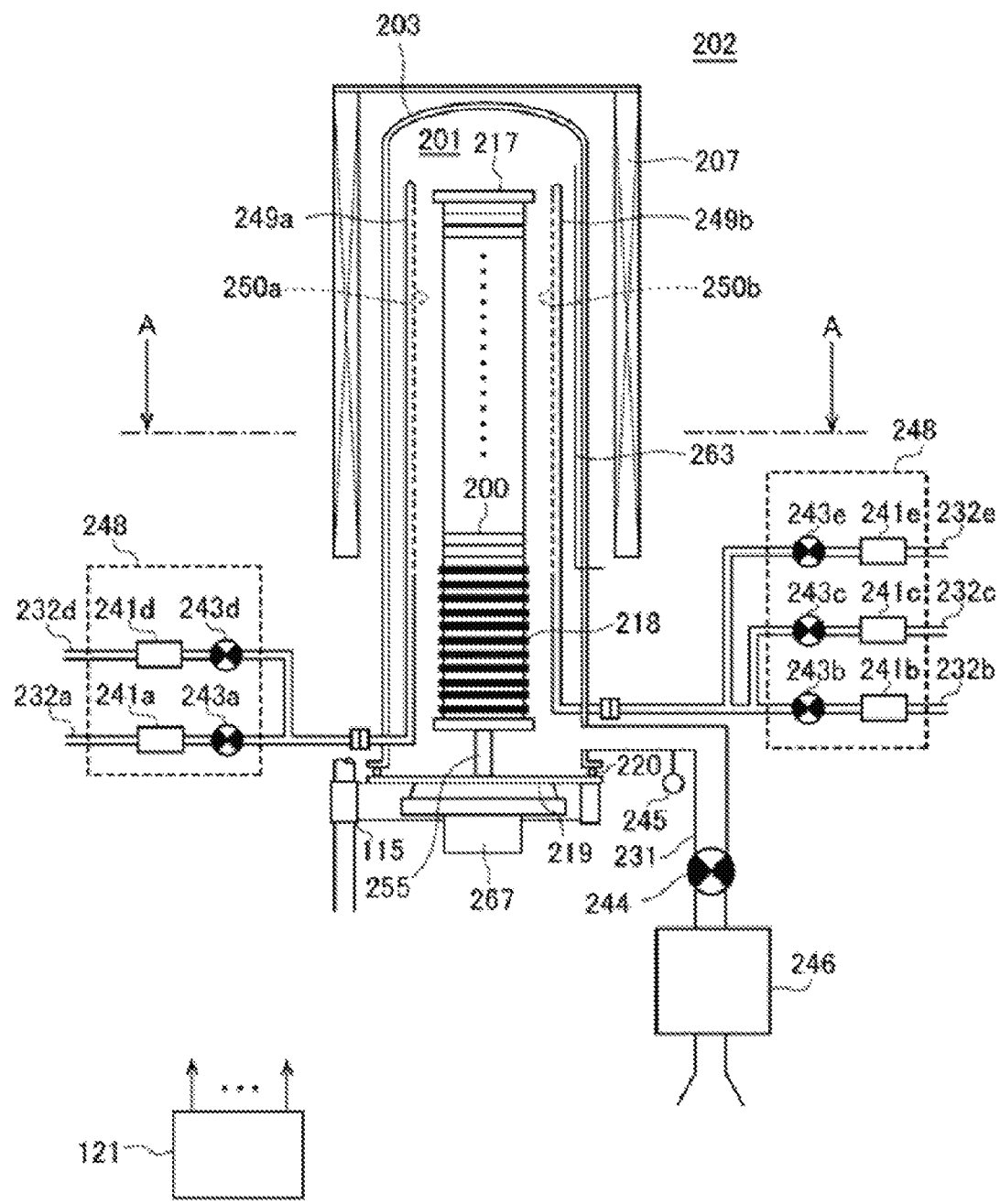
FIG. 1 is a schematic configuration view of a vertical processing furnace of a substrate processing apparatus suitably used in one embodiment of the present disclosure, in which a portion of the processing furnace is shown in a vertical cross section.

As shown in FIG. 1, a processing furnace 202 includes a heater 207 as a heating device (a heating mechanism). The heater 207 has a cylindrical shape and is supported by a support plate so as to be vertically installed. The heater 207 may function as an activation mechanism (e.g., an excitation part) configured to thermally activate (excite) a gas.

A reaction tube 203 constituting a reaction vessel (i.e., a process vessel) is disposed inside the heater 207 in a concentric relationship with the heater 207. The reaction tube 203 is made of, e.g., a heat resistant material such as quartz ($SiO_2$), silicon carbide (SiC), or the like and has a cylindrical shape with its upper end closed and its lower end opened. A process chamber 201 is formed in a hollow cylindrical portion of the reaction tube 203. The process chamber 201 is configured to accommodate wafers 200 as substrates.

Nozzles 249a and 249b are installed inside the process chamber 201 so as to penetrate through the lower side wall of the reaction tube 203. The nozzles 249a and 249b are made of, e.g., a heat resistant material such as quartz, SiC, or the like. Gas supply pipes 232a and 232b are connected to the nozzles 249a and 249b, respectively. A gas supply pipe 232c is connected to the gas supply pipe 232b.

Mass flow controllers (MFCs) 241a to 241c, which are flow rate controllers (flow rate control parts), and valves 243a to 243c, which are opening/closing valves, are installed in the gas supply pipes 232a to 232c sequentially from the corresponding upstream sides, respectively. Gas supply pipes 232d and 232e for supplying an inert gas are respectively connected to the gas supply pipes 232a and 232b at the downstream side of the valves 243a and 243b. An MFC 241d and a valve 243d are installed in the gas supply pipe 232d sequentially from the upstream side while an MFC 241e and a valve 243e are installed in the gas supply pipe 232e sequentially from the upstream side.

Figure 2:
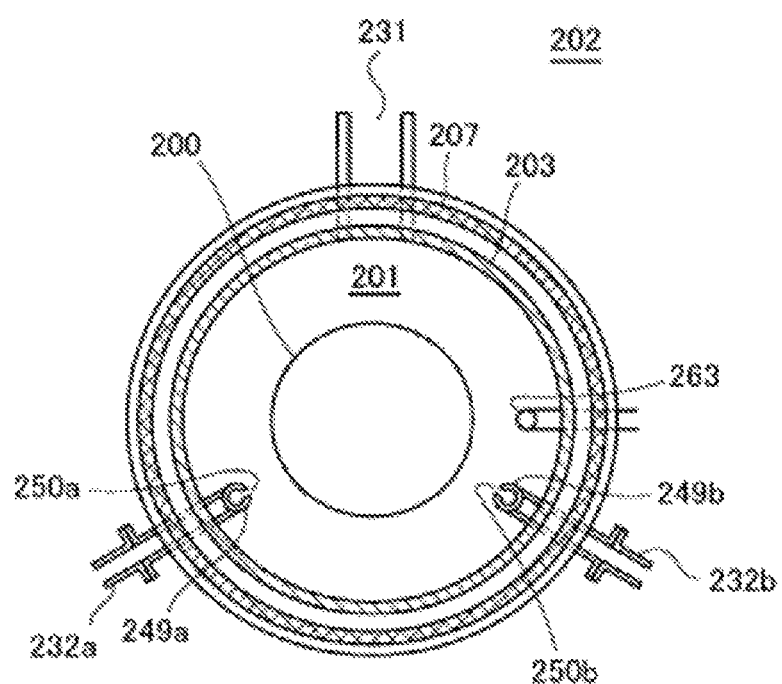
FIG. 2 is a schematic configuration view of the vertical processing furnace of the substrate processing apparatus suitably used in one embodiment of the present disclosure, in which a portion of the processing furnace is shown in a cross section taken along line A-A in FIG. 1.

As shown in FIG. 2, the nozzles 249a and 249b are disposed in an annular space between the inner wall of the reaction tube 203 and the wafers 200 such that the nozzles 249a and 249b extend along a stack direction of the wafers 200 upwardly from a lower portion of the inner wall of the reaction tube 203 to an upper portion thereof. In one embodiment, the nozzles 249a and 249b are installed in a region horizontally surrounding a wafer arrangement region in which the wafers 200 are arranged at a lateral side of the wafer arrangement region, along the wafer arrangement region. Gas supply holes 250a and 250b for supplying a gas are formed on the side surfaces of the nozzles 249a and 249b, respectively. The gas supply holes 250a and 250b are opened toward the center of the reaction tube 203 to allow the gas to be supplied toward the wafers 200. According to some embodiments, a plurality of gas supply holes 250a and 250b may be formed between the lower portion of the reaction tube 203 and the upper portion thereof.

A gas containing a gas containing silicon (Si) as a predetermined element (main element) and a halogen element (i.e., a halosilane precursor gas) is supplied as a halogen-based first processing gas from the gas supply pipe 232a into the process chamber 201 via the MFC 241a, the valve 243a, and the nozzle 249a.

As the first processing gas, it may be possible to use, for example, a halosilane precursor gas containing Si and Cl, i.e., a chlorosilane precursor gas (e.g., a dichlorosilane ($SiH_2Cl_2$, abbreviation: DCS)).

A gas containing impurities (dopants) to be added (doped) in a layer or film to be formed, may be supplied as a dopant gas from the gas supply pipe 232a into the process chamber 201 via the MFC 241a, the valve 243a, and the nozzle 249a. As the dopant gas, it may be possible to use, e.g., a gas containing any one of a group-III element and a group-V element, such as a phosphine ($PH_3$, abbreviation: PH) gas, etc.

A halogen element-free silane precursor gas containing Si as a predetermined element (main element) is supplied as a non-halogen-based second processing gas from the gas supply pipe 232b into the process chamber 201 via the MFC 241b, the valve 243b, and the nozzle 249b. As the second processing gas, it may be possible to use a silicon hydride precursor gas (e.g., a disilane ($Si_2H_6$, abbreviation: DS) gas).

A halogen element-free silane precursor gas containing Si as a predetermined element (main element) is supplied as a third processing gas from the gas supply pipe 232c into the process chamber 201 via the MFC 241c, the valve 243c, the gas supply pipe 232b, and the nozzle 249b. As the third processing gas, it may be possible to use a silicon hydride precursor gas (e.g., a monosilane ($SiH_4$, abbreviation: MS) gas).

A hydrogen (H)-containing gas, is supplied as a reducing gas from the gas supply pipes 232a to 232c into the process chamber 201 via the MFCs 241a to 241c, the valves 243a to 243c, and the nozzles 249a and 249b. As the H-containing gas, it may be possible to use, e.g., a hydrogen (H) gas.

An inert gas, for example, a nitrogen gas, is supplied from the gas supply pipes 232d and 232e into the process chamber 201 via the MFCs 241d and 241e, the valves 243d and 243e, the gas supply pipes 232a and 232b and the nozzles 249a and 249b, respectively.

A first supply system for supplying the first processing gas is mainly constituted by the gas supply pipe 232a, the MFC 241a, and the valve 243a. A second supply system for supplying the second processing gas is mainly constituted by the gas supply pipe 232b, the MFC 241b, and the valve 243b. A third supply system for supplying the third processing gas is mainly constituted by the gas supply pipe 232c, the MFC 241c, and the valve 243c. A fourth supply system for supplying the H-containing gas is mainly constituted by the gas supply pipes 232a to 232c, the MFCs 241a to 241c, and the valves 243a to 243c. A fifth supply system for supplying the dopant gas is mainly constituted by the gas supply pipe 232a, the MFC 241a, and the valve 243a.

Either or all of the first to third supply systems may be referred to as a processing gas supply system or a film forming gas supply system. The fourth supply system or the fifth supply system may be included in the film forming gas supply system.

An inert gas supply system is mainly constituted by the gas supply pipes 232d and 232e, the MFCs 241d and 241e, and the valves 243d to 243e.

Either or all of the above-described various supply systems may be configured as an integrated gas supply system 248 in which the valves 243a to 243e, the MFCs 241a to 241e, etc. are integrated. The integrated gas supply system 248 is connected to each of the gas supply pipes 232a to 232e and is configured such that the operations of supplying various gases into the gas supply pipes 232a to 232e, such as the opening and closing operations of the valves 243a to 243e and the flow rate regulating operation by the MFCs 241a to 241e, etc., are controlled by a controller 121 which will be described later. The integrated gas supply system 248 is configured as an integral type or division type integrated unit and can be attached to and detached from the gas supply pipes 232a to 232e, etc. on an integrated unit basis. Further, the maintenance, replacement, extension, etc. of the gas supply system can be performed on an integrated unit basis.

An exhaust pipe 231 for exhausting an internal atmosphere of the process chamber 201 is installed in the reaction tube 203. A vacuum exhaust device, e.g., a vacuum pump 246, is connected to the exhaust pipe 231 via a pressure sensor 245, which is a pressure detector (pressure detecting part) for detecting an internal pressure of the process chamber 201, and an auto pressure controller (APC) valve 244, which is a pressure regulator (pressure regulating part). The APC valve 244 is configured to perform or stop vacuum exhaust in the process chamber 201 by opening or closing the valve while the vacuum pump 246 is actuated and is also configured to regulate the internal pressure of the process chamber 201 by adjusting an opening degree of the valve pursuant to pressure information detected by the pressure sensor 245 while the vacuum pump 246 is actuated. An exhaust system is mainly constituted by the exhaust pipe 231, the APC valve 244, and the pressure sensor 245. In one embodiment, the vacuum pump 246 may be included in the exhaust system.

A seal cap 219, which serves as a furnace opening cover configured to hermetically seal a lower end opening of the reaction tube 203, is installed under the reaction tube 203. The seal cap 219 is made of metal such as, e.g., stainless steel (SUS) or the like, and is formed in a disc shape. An O-ring 220, which is a seal member making contact with the lower end portion of the reaction tube 203, is installed on an upper surface of the seal cap 219. A rotation mechanism 267 configured to rotate a boat 217, which will be described later, is installed under the seal cap 219. A rotary shaft 255 of the rotation mechanism 267, which penetrates through the seal cap 219, is connected to the boat 217. The rotation mechanism 267 is configured to rotate the wafers 200 by rotating the boat 217. The seal cap 219 is configured to be vertically moved up and down by a boat elevator 115 which is an elevator mechanism installed outside the reaction tube 203. The boat elevator 115 is configured to load and unload the boat 217 into and from the process chamber 201 by moving the seal cap 219 up and down. As such, the boat elevator 115 is configured as a transfer device (transfer mechanism) which transfers the boat 217, ultimately, the wafers 200, into and out of the process chamber 201.

The boat 217 serving as a substrate support is configured to support a plurality of wafers 200, e.g., 25 to 200 wafers, in such a state that the wafers 200 are arranged in a horizontal posture and in multiple stages along a vertical direction, with the centers of the wafers 200 concentrically aligned, to be spaced-apart from one another. The boat 217 is made of a heat resistant material such as quartz or SiC. Heat insulating plates 218 made of a heat resistant material (e.g., quartz, SiC, etc.) are installed below the boat 217 in a horizontal posture and in multiple stages.

A temperature sensor 263 serving as a temperature detector is installed in the reaction tube 203. Based on temperature information detected by the temperature sensor 263, a state of supplying electric power to the heater 207 is adjusted such that the interior of the process chamber 201 has a desired temperature distribution. Similar to the nozzles 249a and 249b, the temperature sensor 263 is installed along the inner wall of the reaction tube 203.

Figure 3:
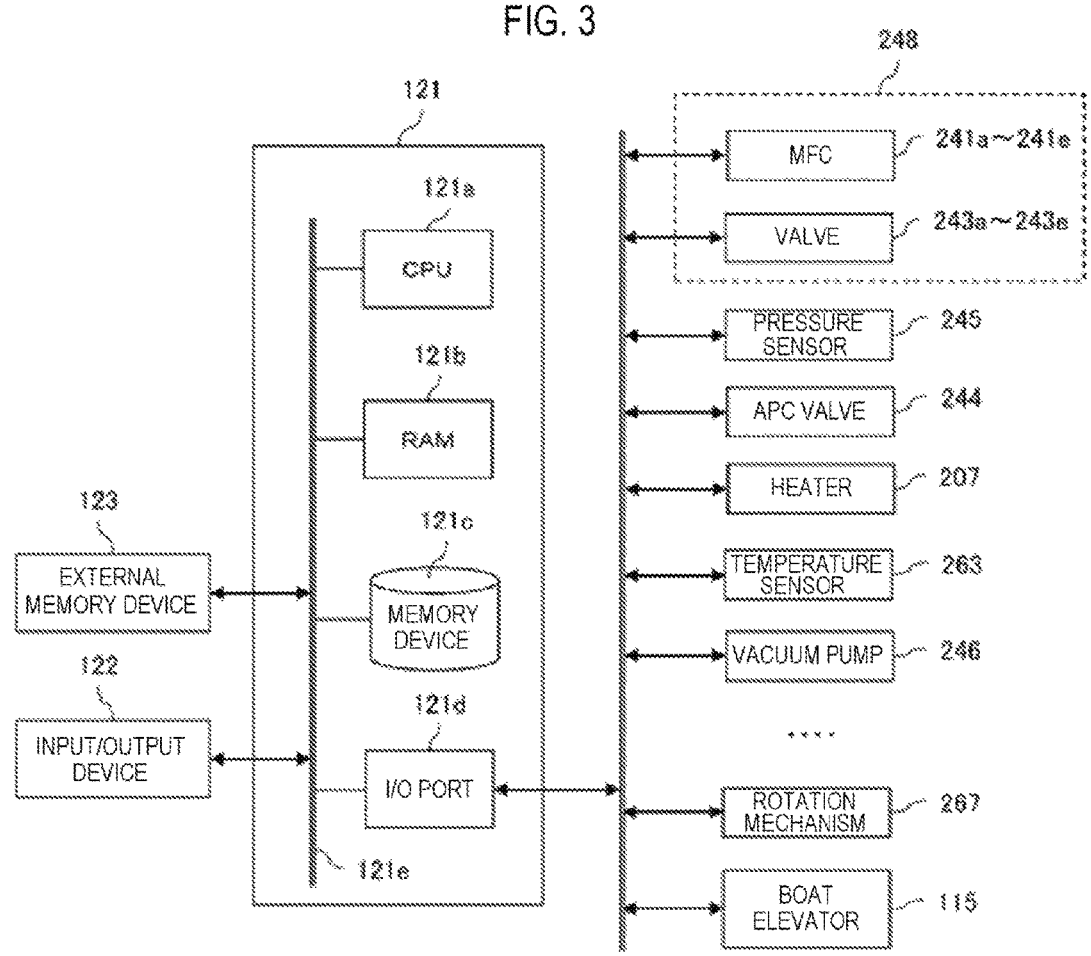
FIG. 3 is a schematic configuration diagram of a controller of the substrate processing apparatus suitably used in one embodiment of the present disclosure, in which a control system of the controller is shown in a block diagram.

As illustrated in FIG. 3, a controller 121, which is a control part (control unit), may be configured as a computer including a central processing unit (CPU) 121a, a random access memory (RAM) 121b, a memory device 121c, and an I/O port 121d. The RAM 121b, the memory device 121c, and the I/O port 121d are configured to exchange data with the CPU 121a via an internal bus 121e. An input/output device 122 formed of, e.g., a touch panel or the like, is connected to the controller 121.

The memory device 121c is configured with, for example, a flash memory, a hard disk drive (HDD), etc. A control program for controlling operations of a substrate processing apparatus or a process recipe, in which a sequence or a condition of processing a substrate to be described later is written, is readably stored in the memory device 121c. The process recipe functions as a program for causing the controller 121 to execute each sequence in the substrate processing procedure, which will be described later, to obtain a predetermined result. Hereinafter, the process recipe and the control program will be generally and simply referred to as a "program." Furthermore, the process recipe will be simply referred to as a "recipe." When the term "program" is used herein, it may indicate a case of including only the recipe, a case of including only the control program, or a case of including both the recipe and the control program. In addition, the RAM 121b is configured as a memory area (work area) in which a program or data read by the CPU 121a is temporarily stored.

The I/O port 121d is connected to the MFCs 241a to 241e, the valves 243a to 243e, the pressure sensor 245, the APC valve 244, the vacuum pump 246, the heater 207, the temperature sensor 263, the rotation mechanism 267, the boat elevator 115, and so on.

The CPU 121a is configured to read and execute the control program from the memory device 121c. The CPU 121a also reads the recipe from the memory device 121c according to an input of an operation command from the input/output device 122. In addition, the CPU 121a is configured to control the flow rate adjusting operation of various kinds of gases by the MFCs 241a to 241e, the opening/closing operation of the valves 243a to 243e, the opening/closing operation of the APC valve 244, the pressure regulating operation performed by the APC valve 244 based on the pressure sensor 245, the start/stop operation of the vacuum pump 246, the temperature adjusting operation by the heater 207 based on the temperature sensor 263, the rotation and rotation speed adjusting operation of the boat 217 by the rotation mechanism 267, the elevation operation of the boat 217 by the boat elevator 115, and so on, according to contents of the read recipe.

The controller 121 may be configured by installing, on a computer, the aforementioned program stored in an external memory device 123 (for example, a magnetic disk such as a hard disk, an optical disk such as a CD or DVD, a magneto-optical disk such as an MO, a semiconductor memory such as a USB memory, etc.). The memory device 121c or the external memory device 123 is configured as a non-transitory computer-readable recording medium. Hereinafter, the memory device 121c or the external memory device 123 will be generally and simply referred to as a "recording medium." When the term "recording medium" is used herein, it may indicate a case of including only the memory device 121c, a case of including only the external memory device 123, or a case of including both the memory device 121c and the external memory device 123. Alternatively, the program may be provided to the computer using communication means such as the Internet, a dedicated line, etc., instead of using the external memory device 123.

(2) Substrate Processing Process

A sequence example of forming a Si film on a substrate using the aforementioned substrate processing apparatus, which is one of the processes for manufacturing a semiconductor device, will be described below with reference to FIGS. 4 and 6A to 6G. In the following description, the operations of the respective parts constituting the substrate processing apparatus are controlled by the controller 121.

A film forming sequence illustrated in FIG. 4 includes a step of forming a seed layer on a wafer 200 as a substrate (a seed step) by performing a cycle a predetermined number of times (n times), the cycle including (alternately performing) a step of supplying a DCS gas as a first processing gas to the wafer 200, and a step of supplying a DS gas as a second processing gas to the wafer 200; and a step of forming a film containing Si, i.e., a Si film, on the seed layer (a CVD film forming step) by supplying a MS gas as a third processing gas to the wafer 200.

The seed step includes a step of supplying a $H_2$ gas as an H-containing gas to the wafer 200. The film forming sequence illustrated in FIG. 4 shows an example where the seed step includes a period in which the step of supplying the DCS gas and the step of supplying the $H_2$ gas are performed simultaneously.

In addition, the seed step includes a step of supplying a PH gas as a dopant gas to the wafer 200, thereby forming a seed layer (a doped seed layer) doped with P serving as a dopant. The film forming sequence illustrated in FIG. 4 shows an example where the seed step includes a period in which the step of supplying the DS gas and the step of supplying the PH gas are performed simultaneously. In addition, this film forming sequence also shows an example where the CVD film forming step includes a step of supplying a PH gas to the wafer 200. In the CVD film forming step, a Si film doped with P serving as a dopant is formed on the seed layer. In the following description, a seed layer doped with P is also simply referred to as a seed layer. A Si film doped with P is also simply referred to as a Si film.

In the film forming sequence illustrated in FIG. 4, the above-described seed step and CVD film forming step are carried out on the wafer 200 having a surface on which single crystal Si and an insulating film are exposed. Thus, a first Si film is homoepitaxially grown on the single crystal Si and a second Si film having a different crystal structure from the first Si film is grown on the insulating film. As such, in the film forming sequence illustrated in FIG. 4, three kinds of silane precursor gases are used to form, on the single crystal Si, a laminated structure (a laminated film) including the first Si film and the second Si film formed thereon. In this embodiment, a film having this laminated structure may be sometimes simply referred to as a Si film.

Thereafter, in the present embodiment, a step of subjecting the Si film having the above-described laminated structure to heat treatment (annealing) to homoepitaxialize a portion of the second Si film that is in contact with the first Si film (homoepitaxial Si film) (an annealing step) is performed.

In the present disclosure, these series of sequences may be indicated as follows for the sake of convenience. In addition, in the present disclosure, the above-described seed step may be referred to as a "parallel seed step" and the above-described annealing step may be referred to as "ANL."

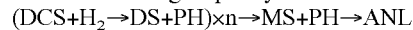
(DCS+H$_2$→DS+PH)×n→MS+PH→ANL

When the term "wafer" is used in the present disclosure, the wafer may refer to "a wafer itself" or "a wafer and a laminated body (aggregate) of predetermined layers or films formed on a surface of the wafer." As such, a wafer including predetermined layers or films formed on its surface may be referred to as a wafer. In addition, when the phrase "a surface of a wafer" is used in the present disclosure, "a surface of a wafer" may refer to "a surface (exposed surface) of a wafer itself" or "a surface of a predetermined layer or film formed on a wafer, namely an uppermost surface of the wafer, which is a laminated body."

Accordingly, in the present disclosure, the expression "a predetermined gas is supplied to a wafer" may indicate that "a predetermined gas is directly supplied to a surface (exposed surface) of a wafer itself" or that "a predetermined gas is supplied to a layer or film formed on a wafer, namely on an uppermost surface of a wafer as a laminated body." Furthermore, in the present disclosure, the expression "a predetermined layer (or film) is formed on a wafer" may indicate that "a predetermined layer (or film) is directly formed on a surface (exposed surface) of a wafer itself" or that "a predetermined layer (or film) is formed on a layer or film formed on a wafer, namely on an uppermost surface of a wafer as a laminated body."

In addition, when the term "substrate" is used in the present disclosure, the "substrate" may be synonymous with the term "wafer."

(Wafer Charging and Boat Loading)

A plurality of wafers 200 may be charged on the boat 217 (wafer charging). Thereafter, as illustrated in FIG. 1, the boat 217 supporting the plurality of wafers 200 is lifted up by the boat elevator 115 to be loaded into the process chamber 201 (boat loading). In this state, the seal cap 219 seals the lower end of the reaction tube 203 through the O-ring 220.

As the wafer 200, for example, a Si substrate formed of single crystal Si or a substrate having a single crystal Si film formed on its surface may be used. On a portion of the surface of the wafer 200 is formed in advance, for example, an insulating film 200a such as a silicon oxide film (a SiO$_2$ film, hereinafter also referred to as a SiO film) or the like. As such, the surface of the wafer 200 is in a state in which each of the single crystal Si and the insulating film 200a is exposed. The insulating film 200a may be a silicon nitride film (a SiN film), a silicon oxynitride film (a SiON film), or the like, in addition to the SiO film.

Figure 6A:
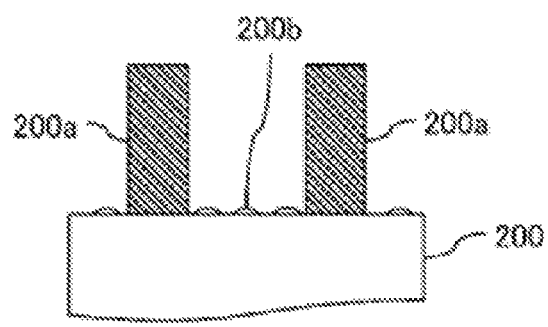
FIG. 6A is a cross-sectional structural view of a wafer surface before starting a seed step.

FIGS. 6A to 6G show a case of processing a wafer 200 having a surface formed thereon with a concave portion, which has a bottom formed of monocrystalline Si and a side and top formed of an insulating film (SiO film) 200a. FIGS. 6A to 6G are partially-enlarged sectional views of the surface of the wafer 200. Before the wafer 200 is loaded into the process chamber 201, the surface of the wafer 200 is cleaned in advance with hydrogen fluoride (HF) or the like. However, the surface of the wafer 200 may be temporarily exposed to the atmosphere until the wafer 200 is loaded into the process chamber 201 after the cleaning process. Therefore, as shown in FIG. 6A, a natural oxide film (SiO film) 200b is formed on at least a portion of the surface of the wafer 200 loaded into the process chamber 201. The natural oxide film 200b may be formed so as to sparsely cover the bottom of the concave portion (in an island shape), that is, a portion of the exposed single crystal Si and to cover the entire region of the exposed single crystal Si continuously (in a non-island shape).

(Pressure Adjustment and Temperature Adjustment)

The interior of the process chamber 201, namely the space in which the wafers 200 exist, is vacuum-exhausted (depressurization-exhausted) by the vacuum pump 246 so as to reach a desired pressure (degree of vacuum). In this operation, the internal pressure of the process chamber 201 is measured by the pressure sensor 245. The APC valve 244 is feedback-controlled based on the measured pressure information. The vacuum pump 246 may be continuously activated at least until the processing of the wafers 200 is completed. The wafers 200 in the process chamber 201 are heated by the heater 207 to a desired temperature. In this operation, the state of supplying electric power to the heater 207 is feedback-controlled based on the temperature information detected by the temperature sensor 263 such that the interior of the process chamber 201 has a desired temperature distribution. In addition, the heating of the interior of the process chamber 201 by the heater 207 may be continuously performed at least until the processing of the wafers 200 is completed. Further, the rotation of the boat 217 and the wafers 200 by the rotation mechanism 267 begins. The rotation of the boat 217 and the wafers 200 by the rotation mechanism 267 may be continuously performed at least until the processing of the wafers 200 is completed.

(Seed Step)

Thereafter, the following two steps 1 and 2 are sequentially performed.

[Step 1]

At this step, a DCS gas and a H$_2$ gas are supplied to the wafer 200 in the process chamber 201.

The valve 243a is opened to allow the DCS gas to flow through the gas supply pipe 232a. A flow rate of the DCS gas is adjusted by the MFC 241a, and then the DCS gas is supplied into the process chamber 201 via the nozzle 249a and is exhausted through the exhaust pipe 231. At this time, the valve 243c is opened to allow the H$_2$ gas to flow through the gas supply pipe 232a. A flow rate of the H$_2$ gas is adjusted by the MFC 241c, and then the H$_2$ gas is supplied into the process chamber 201 via the nozzle 249b and is exhausted through the exhaust pipe 231. At this time, the DCS gas and the $H_2$ gas are simultaneously supplied to the wafer 200. At this time, the valve 243d is opened to allow a $N_2$ gas to flow through the gas supply pipe 232d. A flow rate of the $N_2$ gas is adjusted by the MFC 241d, and the $N_2$ gas is supplied into the process chamber 201 together with the DCS gas and is exhausted through the exhaust pipe 231. In addition, at this time, the valve 243e is opened to allow a $N_2$ gas to flow through the gas supply pipe 232e. A flow rate of the $N_2$ gas is adjusted by the MFC 241e, and the $N_2$ gas is supplied into the process chamber 201 together with the $H_2$ gas and is exhausted through the exhaust pipe 231.

By supplying the DCS gas to the wafer 200, it is possible to generate a treatment effect by DCS and progress the following process. Thus, the surface state of the wafer 200 can be changed to a state shown in FIG. 6B.

First, by supplying DCS containing halogen (Cl) having high electronegativity onto the bottom of the concave portion, that is, onto the single crystal Si, oxygen (O) in the natural oxide film 200b formed on the surface of the single crystal Si and Cl in the DCS are introduced to break a Si—O bond contained in the natural oxide film 200b. As such, due to the polarity of the DCS, it is possible to cut the Si—O bond terminating the surface of the single crystal Si. In addition, it is also possible to break the Si—O bond terminating the surface of the single crystal Si by a small amount of $Cl^-$ (Cl ions) generated by separation from DCS. Thus, a bonding hand of Si on the surface of the single crystal Si becomes free. That is, a dangling bond of Si can be generated on the surface of the single crystal Si. This can provide a better environment in which homoepitaxial growth to be described later is likely to proceed. In addition, at the bottom of the concave portion, as the above-described reaction proceeds, the natural oxide film 200b formed on the surface is removed and the surface of the single crystal Si is exposed. As such, the DCS gas acts as a cleaning gas for removing the natural oxide film 200b from the surface of the single crystal Si.

In addition, by supplying DCS containing halogen (Cl) with high electronegativity onto the side and top of the concave portion, i.e., onto the insulating film (SiO film) 200a, 0 in the surface of the insulating film 200a and Cl in the DCS are introduced to break a Si—O bond contained in the insulating film 200a. As such, due to the polarity of the DCS, it is possible to cut the Si—O bond included in the surface of the insulating film 200a. In addition, it is also possible to break the Si—O bond included in the surface of the insulating film 200a by a small amount of $Cl^-$ generated by separation from DCS. Thus, a dangling bond of Si, that is, a Si adsorption site, can be formed on the surface of the insulating film 200a. A dangling bond of Si does not originally exist on the insulating film 200a such as a SiO film or the like, or is minute even if it is present. Therefore, in this state, even if step 2 to be described later for supplying the DS gas to the wafer 200 is carried out, the nucleus of Si does not grow on the surface of the insulating film 200a, or grows randomly even if it grows (island-shaped growth).

At this time, by supplying the $H_2$ gas to the wafer 200, it is possible to effectively remove the residual Cl which is generated by the above-mentioned treatment by the DCS gas and causes a hindrance of the seed formation by the DS gas in step 2. However, it may be necessary to set the supply amount (supply flow rate, supply time, etc.) of the $H_2$ gas to such an extent that it does not hinder the above-mentioned treatment effect.

The above-mentioned treatment effect provides a better environment in which homoepitaxial growth is likely to proceed at the bottom of the concave portion. In addition, when Si adsorption sites are formed at the side and top of the concave portion, the valve 243a is closed to stop the supply of the DCS gas. Further, the valve 243c is closed to stop the supply of the $H_2$ gas. At this time, with the APC valve 244 kept open, the interior of the process chamber 201 is vacuum-exhausted by the vacuum pump 246, and an unreacted gas remaining in the process chamber 201 or a gas which has contributed to the above-described reaction is excluded from the interior of the process chamber 201. At this time, with the valves 243d and 243e kept open, the supply of the $N_2$ gas into the process chamber 201 is maintained. The $N_2$ gas acts as a purge gas.

[Step 2]

After step 1 is completed, a DS gas and a PH gas are supplied to the wafer 200 in the process chamber 201.

In this step, the opening/closing control of the valves 243b, 243d and 243e is performed in the same procedure as the opening/closing control of the valves 243a, 243d and 243e performed in step 1. A flow rate of the DS gas flowing through the gas supply pipe 232b is adjusted by the MFC 241b and the DC gas is supplied into the process chamber 201 via the nozzle 249b and is exhausted through the exhaust pipe 231. At this time, the valve 243a is opened to allow the PH gas to flow through the gas supply pipe 232a. A flow rate of the PH gas is adjusted by the MFC 241a and the PH gas is supplied into the process chamber 201 via the nozzle 249a and is exhausted through the exhaust pipe 231. At this time, the DS gas and the PH gas are simultaneously supplied to the wafer 200.

Figure 6B:
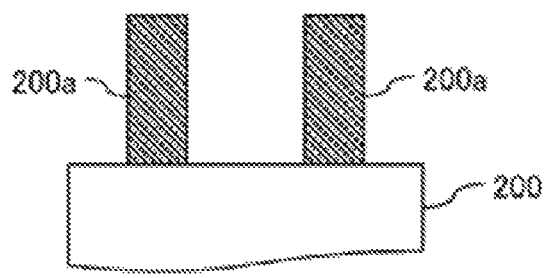
FIG. 6B is a cross-sectional structural view of the wafer surface after supply of a DCS gas under the seed step.
Figure 6C:
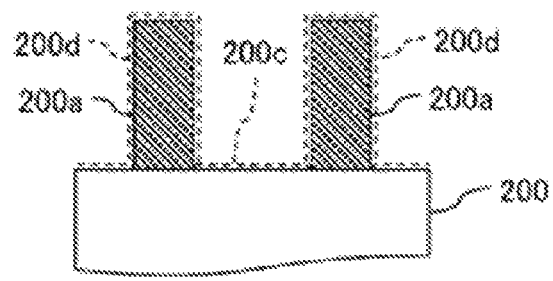
FIG. 6C is a cross-sectional structural view of the wafer surface after supply of a DS gas under the seed step.
Figure 6D:
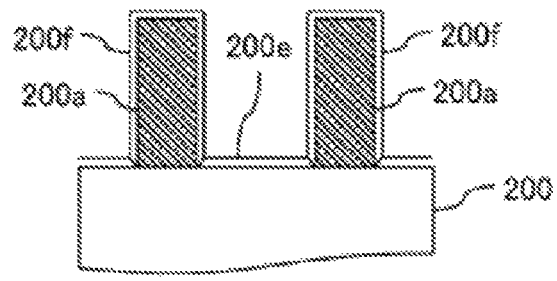
FIG. 6D is a cross-sectional structural view of the wafer surface after completion of the seed step.

By supplying the DS gas and the PH gas to the wafer 200, it is possible to progress the following process to change the surface state of the wafer 200 to a state shown in FIG. 6B, that is, a state where two kinds of seeds are formed in parallel.

First, on the bottom of the concave portion, that is, on the single crystal Si, Si contained in DS is bonded to a dangling bond of Si formed by carrying out step 1 to thereby epitaxially grow a Si crystal on the single crystal Si (vapor phase epitaxial growth). Since an underlying crystal and a crystal growing on this underlying crystal is made of the same material (Si), this growth is homoepitaxial growth. In the homoepitaxial growth, a crystal having the same lattice constant as this crystal and made of the same material grows in the same crystal orientation on the underlying crystal. Thus, in the homoepitaxial growth, it is possible to obtain high quality crystals with fewer defects than heteroepitaxial growth consisting of different materials from the underlying crystal and the crystal grown on this underlying crystal. The nucleus (or film) formed at this time becomes a seed (first seed) 200c of a first Si film (epitaxial Si film) 200h to be described later. By supplying the PH gas together with the DS gas, the seed 200c can be doped with a P component as a dopant.

Further, on the side and top of the concave, that is, on the insulating film 200a, Si contained in the DS can be adsorbed to the adsorption site formed by carrying out step 1. The crystal structure of the nucleus formed by adsorption of Si to the adsorption site is amorphous (non-crystalline), poly (poly-crystal), or a mixture of amorphous and poly. The nucleus formed at this time becomes a seed (second seed) 200d of a second Si film 200g to be described later. By supplying the PH gas together with the DS gas, the seed 200d can be doped with a P component as a dopant.

After the formation of the first seed 200c and the second seed 200d, that is, the formation of the two kinds of seeds, is completed, the valves 243b and 243a are closed to stop the supply of the DS gas and the PH gas, respectively. Then, according to the same processing procedure as in step 1, an unreacted gas remaining in the process chamber 201 or a gas which has contributed to the above-described reaction, and reaction byproducts, are excluded from the process chamber 201.

When step 2 is performed, at least a portion of the surface of the wafer 200, i.e., at least a portion of the surfaces of the seeds 200c and 200d, may be terminated by a Si—H bond contained in the DS gas. The Si—H bond terminating the surface of the wafer 200 can be cut by supplying the DCS gas to the wafer 200 in the next step 1. As such, the Si—H bond terminating the surfaces of the seeds 200c and 200d can be cut by a small amount of Cl⁻ generated by separation from the DCS. Thus, a dangling bond of Si can be formed on the surfaces of the seeds 200c and 200d. As such, it is possible to prepare an environment where homoepitaxial growth is likely to proceed at the bottom of the concave portion, and it is possible to re-form Si adsorption sites at the side and top of the concave portion. This makes it possible to start formation of the above-described two kinds of seeds without delay in the next step 2.

When step 2 is performed, Si may abnormally grow on the surface of the wafer 200. For example, when step 2 is performed, an uneven structure may be formed on the surfaces of the seeds 200c and 200d, such as local agglomeration of Si adsorbed on the surface of the wafer 200. However, this abnormally grown Si (a convex portion formed of aggregated Si) can be removed by supplying the DCS gas to the wafer 200 in the next step 1. As such, it is possible to cut a Si—Si bond contained in the abnormally grown Si by a small amount of Cl⁻ generated by separation from DCS and to etch this abnormally grown Si. Thus, the surfaces of the seeds 200c and 200d are smoothed, which can result in improvement of surface roughness, etc. of a Si film finally formed. The term "surface roughness" used herein may indicate a difference in height of a film in the wafer surface. The smaller the surface roughness, the more the surface is smooth. As such, the improvement of the surface roughness may indicate that the height difference of the film is reduced and the smoothness of the surface is improved. Even in this case, the action of the $H_2$ gas supplied together with the DCS gas can contribute to effectively remove the residual Cl which is a factor that inhibits formation of a seed by the DS gas in the next step 2.

Each of the effects shown here can be considered to be included in the above-mentioned treatment effect by DCS.

(Performing a Predetermined Number of Times)

In the seed step, a cycle which alternately, i.e., non-simultaneously without synchronization, performs steps 1 and 2 as above described is performed a predetermined number of times (once or more). By carrying out the seed step, the following process can be progressed to change the surface state of the wafer 200 to a state shown in FIG. 6D. In addition, by performing steps 1 and 2 non-simultaneously, it is possible to reduce the amount of particles generated in the process chamber 201.

First, a seed layer (first seed layer) 200e can be formed at the bottom of the concave portion, that is, on the single crystal Si. The seed layer 200e is formed by homoepitaxial growth of a Si crystal with the first seed 200c formed on the single crystal Si as a nucleus. The crystal structure of the seed layer 200e is a single crystal inheriting the crystallinity of an underlying layer. As such, the seed layer 200e is made of the same material as the underlying single crystal Si and becomes a single crystal Si layer (epitaxial Si layer) having the same lattice constant and the same crystal orientation.

Further, a seed layer (second seed layer) 200f can be formed on the side and top of the concave portion, that is, on the insulating film 200a. The seed layer 200f is formed by growing the second seed 200d at a high density on the insulating film 200a and closely covers the surface of the insulating film 200a. The crystal structure of the seed layer 200f is amorphous, poly, or a mixture of amorphous and poly.

Thus, in the seed step, the first seed layer (epitaxial Si layer) and the second seed layer (an amorphous Si layer, a poly Si layer, or a mixture thereof) are formed on single crystal Si and the insulating film 200a in parallel. As such, in this step, two kinds of Si seed layers having different crystal structures are formed in parallel. This is why this step is called a parallel seed step. In this step, each of the first seed layer 200e and the second seed layer 200f can be formed into a dense layer by appropriately exhibiting the above-mentioned treatment effect. Thus, the finally formed Si film can be formed into a dense film with few pinholes and less film breakage (these are collectively referred to as film breakage, etc.), and a film with high resistance to HF. The term "pinhole" used herein may refer to a path through which an etchant intrudes toward an underlying layer of a film when an etchant such as an etching gas, an etching solution, etc. is supplied to the film. Further, the term "film breakage" used herein may refer to, for example, a defect occurring on a larger scale than the pinhole. The film breakage, etc. is particularly likely to occur when the film thickness of a Si film is small. Thus, it can be said that the technical significance of generating the treatment effect is particularly large when the film thickness of the Si film is small.

As described above, since each of the seed layers 200c and 200d contains P, each of the seed layers 200e and 200f also contain P as a dopant. Thus, each of the seed layers 200e and 200f has conductivity.

The P concentration in the seed layer 200e may be smaller (lower) than the P concentration in the first Si film 200h to be described later. Similarly, the P concentration in the seed layer 200f may be smaller (lower) than the P concentration in the second Si film 200g to be described later.

Under the processing conditions to be described below, the P concentrations in the seed layers 200e and 200f may be set to fall within a range of, e.g., $1\times10^{10}$ to $1\times10^{19}$ atoms/cm³. Further, the P concentrations in the first Si film 200h and the second Si film 200g may be set to fall within a range of, e.g., $1\times10^{19}$ to $1\times10^{23}$ atoms/cm³.

The processing conditions of the seed step will be described below. The conditions shown here are also the conditions that make it possible to appropriately exhibit the above-mentioned treatment effect. In addition, the conditions shown here are also the conditions that make it possible to appropriately exhibiting the effect of reducing contact resistance and the effect of improving surface roughness, as will be described later.

The supply flow rate of the DCS gas in step 1 is set to fall within a range of, e.g., 1 to 2000 sccm. Further, the supply flow rate of the $H_2$ gas in step 1 is set to fall within a range of, e.g., 1 to 10,000 sccm. The supply time of the DCS gas and the $H_2$ gas is set to fall within a range of, e.g., 2 to 10 minutes.

The supply flow rate of the DS gas in step 2 is set to fall within a range of, e.g., 1 to 2,000 sccm. Further, the supply flow rate of the PH gas in step 2 is set to fall within a range of 1 to 2,000 sccm. The supply flow rate of the PH gas in step 2 may be smaller (lower) than the supply flow rate of the PH gas in the CVD film forming step to be described later. Thus, the P concentrations in the seed layers 200e and 200f can be set to the above-described concentration, which can be made smaller than the P concentrations in the first Si film 200h and the second Si film 200g. The same effect can be obtained by setting the partial pressure (concentration) of the PH gas in step 2 to be smaller than the partial pressure (concentration) of the PH gas in the CVD film forming step to be described later. The supply time of the DS gas and the PH gas may be set to fall within a range of, e.g., 0.5 to 10 minutes, specifically 1 to 5 minutes. The supply flow rate of the PH gas in step 2 may also be set to 0 sccm, i.e., no PH gas may be supplied, in which case the seed layers 200e and 200f become non-doped Si seed layers.

In steps 1 and 2, the supply flow rate of the $N_2$ gas supplied from each gas supply pipe is set to fall within a range of, e.g., 0 to 10,000 sccm. Incidentally, by supplying no $N_2$ gas, it becomes possible to increase the partial pressure of each processing gas and improve the layer quality.

The internal pressure $P_1$ of the process chamber 201 in step 1 may be is made larger than the internal pressure $P_2$ of the process chamber 201 in step 2 ($P_1>P_2$). By doing so, it is possible to enhance the above-mentioned treatment effect as compared with a case of $P_1 \leq P_2$.

As such, by setting $P_1$ to be larger than $P_2$, the flow rate of the DCS gas supplied into the process chamber 201 becomes lower than that in the case of $P_1 \leq P_2$. Thus, the contact time between the surface of the wafer 200 and the DCS can be lengthened and the amount of thermal energy transferred from the heated wafer 200 to the DCS can be increased. This makes it possible to promote the separation of Cl from the DCS to increase the amount of Cl$^-$ supplied to the wafer 200. Thus, it is possible to enhance the treatment effect.

Further, by setting $P_1$ to be larger than $P_2$, the amount of DCS supplied to the wafer 200 is increased over the case of $P_1 \leq P_2$. Further, in the case of $P_1>P_2$, as described above, it is ensured that the contact time between the surface of the wafer 200 and the DCS is lengthened. Thus, the action due to the polarity of DCS, that is, the cut of the Si—O bond and the Si—H bond, is promoted, which can result in enhancement of the treatment effect. This makes it possible to make each of the first seed layer and the second seed layer into a dense layer. Thus, it becomes possible to make the laminated film into a dense film with less film breakage, etc.

In one embodiment, $P_1$ may be set to a pressure (first pressure) within a range of, e.g., 400 Pa to 1,000 Pa under a first temperature to be described later.

When $P_1$ is less than 400 Pa, the amount of Cl to be separated from the DCS, that is, the amount of Cl$^-$ to be supplied to the wafer 200, is insufficient or the amount of DCS to be supplied to the wafer 200 is insufficient, which may result in difficulty in obtaining the above-mentioned treatment effect. By setting $P_1$ to be equal to or more than 400 Pa, it is possible to sufficiently increase the amount of Cl$^-$ and the amount of DCS to be supplied to the wafer 200 so that the above-mentioned treatment effect can be obtained.

When $P_1$ exceeds 1,000 Pa, Si contained in the DCS supplied in step 1 may be deposited on the wafer 200. In this case, Si is deposited before the natural oxide film is removed from the surface of the single crystal Si. Thus, on the single crystal Si (on the natural oxide film), homoepitaxial growth does not proceed and an amorphous Si film or a poly Si film grows. In addition, when $P_1$ exceeds 1,000 Pa, the above-mentioned treatment effect utilizing the polarity of DCS, etc. may not be obtained. By setting $P_1$ to be equal to or less than 1,000 Pa, it becomes possible to solve these problems.

Further, $P_2$ may be set to a pressure (second pressure) within a range of, e.g., 250 Pa to 350 Pa under the first temperature to be described later.

When $P_2$ is less than 250 Pa, it may be difficult for the DS supplied in step 2 to be decomposed, thereby making it difficult to form the first seed 200c and the second seed 200d on the wafer 200. By setting $P_2$ to be equal to or more than 250 Pa, it is possible to solve this problem.

When $P_2$ exceeds 350 Pa, an excessive gas phase reaction occurs, so that the thickness uniformity and step coverage of the first seed 200c and the second seed 200d are likely to be deteriorated, thereby making it difficult to control them. Further, there is a possibility that particles are generated in the process chamber 201. By setting $P_2$ to be equal to or less than 350 Pa, it is possible to solve these problems.

From these points, it is preferable to set $P_1$ to be larger than $P_2$. For example, $P_1$ may be set to fall within a range of, e.g., 400 Pa to 1,000 Pa, while $P_2$ may be set to fall within a range of, e.g., 250 Pa to 350 Pa. In addition, $P_2$ may be set to be larger than the internal pressure ($P_3$) of the process chamber 201 in the CVD film forming step to be described later. As such, it is better to set a relationship of $P_1>P_2>P_3$. By setting such a relationship between $P_1$, $P_2$ and $P_3$ and maintaining such a pressure balance, it is possible to further enhance the above-mentioned treatment effect while enhancing the film thickness uniformity and step coverage of a finally formed Si film. This makes it possible to make the finally formed Si film into a more dense film having higher film thickness uniformity and higher step coverage and having less film breakage, etc.

The temperature of the heater 207 in steps 1 and 2 is set to a temperature such that the temperature of the wafer 200 becomes a temperature (first temperature) within a range of, e.g., 300 to 450 degrees C., specifically 370 to 390 degrees C.

When the temperature of the wafer 200 is lower than 300 degrees C., the above-mentioned treatment effect may not be obtained in step 1 and DS may be hardly decomposed (thermally decomposed) in step 2. By setting the temperature of the wafer 200 to 300 degrees C. or higher, it is possible to solve these problems. By setting the temperature of the wafer 200 to 370 degrees C. or higher, it is possible to further enhance the above-mentioned treatment effect in step 1 and to further promote the decomposition of DS in step 2.

When the temperature of the wafer 200 exceeds 450 degrees C., Si contained in DCS supplied in step 1 may be deposited on the wafer 200. In this case, as described above, the homoepitaxial growth does not proceed on the single crystal Si (on the natural oxide film) and the amorphous Si film and the poly Si film grow. In addition, when the temperature of the wafer 200 exceeds 450 degrees C., the above-mentioned treatment effect utilizing the polarity of DCS, etc. may not be obtained. By setting the temperature of the wafer 200 to 450 degrees C. or lower, it is possible to solve these problems. By setting the temperature of the wafer 200 to 390 degrees C. or lower, it is possible to further enhance the above-mentioned treatment effect while reliably suppressing the deposition of Si contained in the DCS on the wafer 200.

The thickness of each of the seed layers 200e and 200f formed by alternately performing steps 1 and 2 is set to fall within a range of, e.g., 0.1 to 10 nm, specifically 1 to 5 nm, more specifically 1 to 3 nm. By performing the cycle plural times, it is possible to increase the density of each of the first seed layer 200c and the second seed layer 200d while avoiding the seed layers 200e and 200f from growing into an island shape. Thus, the laminated film formed on the wafer 200 can be a dense film with good surface roughness and with less film breakage, etc.

As the first processing gas, in addition to the DCS gas, it may be possible to use, e.g., a chlorosilane precursor gas such as a monochlorosilane ($SiH_3Cl$, abbreviation: MCS) gas, a tetrachlorosilane ($SiCl_4$, abbreviation: STC) gas, a trichlorosilane ($SiHCl_3$, abbreviation: TCS) gas, a hexachlorodisilane ($Si_2Cl_6$, abbreviation: HCDS) gas or the like.

As the second processing gas, in addition to the DS gas, it may be possible to use, e.g., a halogen element-free silane source gas such as a MS gas, a trisilane ($Si_3H_8$) gas, a tetrasilane ($Si_4H_{10}$) gas, a pentasilane ($Si_5H_{12}$) gas, a hexasilane ($Si_6H_{14}$) gas, etc.

As the dopant gas, in addition to the P-containing gas such as the PH gas, it may be possible to use, e.g., a gas containing a group V element such as arsenic (As), antimony (Sb), etc., for example, an arsine ($AsH_3$) gas, a stibine ($SbH_3$) gas, or the like. In addition, as the dopant gas, in addition to the group V element-containing gas, it may be possible to use, e.g., a gas containing a group III element such as boron (B), aluminum (Al) or gallium (Ga), for example, a diborane ($B_2H_6$) gas, a trimethyl aluminum ($Al(CH_3)_3$) gas, a trimethyl gallium ($Ga(CH_3)_3$) gas, etc.

As the H-containing gas, in addition to the $H_2$ gas, it may be possible to use, e.g., a MS gas, a deuterium ($D_2$) gas, or the like.

As the inert gas, in addition to the $N_2$ gas, it may be possible to use, e.g., a rare gas such as an Ar gas, a He gas, a Ne gas, a Xe gas, etc.

(CVD Film Forming Step)

After the seed layers 200e and 200f are formed, a MS gas and a PH gas are supplied to the wafer 200 in the process chamber 201.

In this step, the opening/closing control of the valves 243c, 243a, 243d and 243e is performed in the same procedure as the opening/closing control of the valves 243b, 243a, 243d and 243e performed in step 2. A flow rate of the MS gas flowing through the gas supply pipe 232c is adjusted by the MFC 241c and the MS gas is supplied into the process chamber 201 via the gas supply pipe 232b and the nozzle 249b and is exhausted through the exhaust pipe 231. A flow rate of the PH gas flowing through the gas supply pipe 232a is adjusted by the MFC 241a and the PH gas is supplied into the process chamber 201 via the nozzle 249a and is exhausted through the exhaust pipe 231. At this time, the MS gas and the PH gas are simultaneously supplied to the wafer 200.

Figure 6E:
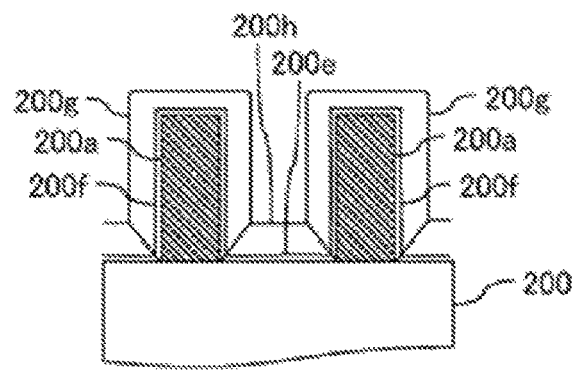
FIG. 6E is a cross-sectional structural view of the wafer surface under a CVD film forming step.
Figure 6F:
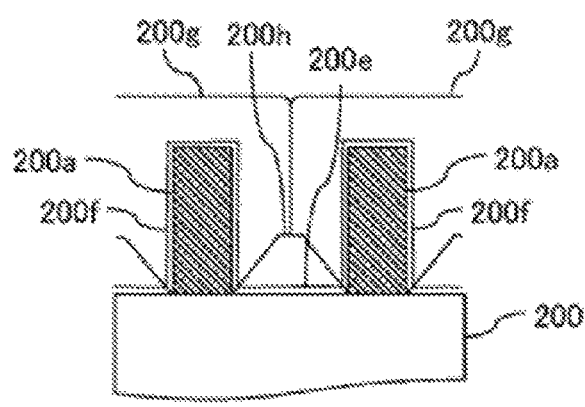
FIG. 6F is a cross-sectional structural view of the wafer surface after completion of the CVD film forming step.

By supplying the MS gas and the PH gas to the wafer 200, it is possible to progress the following process to sequentially change the surface of the wafer 200 to states shown in FIGS. 6E and 6F.

First, as shown in FIG. 6E, on the bottom of the concave portion, that is, on the single crystal Si, the first Si film 200h can be formed on the first seed layer 200e formed by performing the seed step. As such, the first Si film (epitaxial Si film) 200h having the same crystal structure as the seed layer 200e can be homoepitaxially grown (vapor phase epitaxial growth) on the seed layer (epitaxial Si layer) 200e. The crystal structure of the first Si film 200h is a single crystal inheriting the crystallinity of an underlying layer. By supplying the PH gas together with the MS gas, as in the seed layer 200e, the first Si film 200h can be doped with a P component as a dopant. Since the seed layer 200e is very thin and has the same crystal structure and material as the first Si film 200h, the seed layer 200e may be considered to be included in the first Si film 200h.

Further, as shown in FIG. 6E, on the side and top of the concave portion, that is, on the insulating film 200a, the second Si film 200g can be formed on the second seed layer 200f formed by performing the seed step. The crystal structure of the second Si film 200g is amorphous, poly, or a mixture of amorphous and poly. By supplying the PH gas together with the MS gas, as in the seed layer 200f, the second Si film 200g can be doped with a P component as a dopant. Since the seed layer 200f is very thin and has the same crystal structure and material as the second Si film 200g, the seed layer 200f may be considered to be included in the second Si film 200g.

By continuing the above-described process, the growth of the first Si film 200h can be stopped by growth of the second Si film 200g. As such, as shown in FIG. 6F, by covering the top of the first Si film 200h with the second Si film 200g grown from the side of the concave portion, the homoepitaxial growth of the first Si film 200h can be stopped. In this state, a laminated structure (laminated film) including the first Si film 200h and the second Si film 200g laminated thereon is formed in the concave portion, that is, on the wafer 200. As such, a Si film having an epitaxial Si layer is formed at an interface with the surface of the wafer 200. The inside of the concave portion is closed by or filled with this laminated film. This structure makes it possible to lower the contact resistance of the laminated film. As described above, in the present disclosure, a film having this laminated structure is also referred to as a Si film.

After the laminated film is formed, the valves 243c and 243a are closed to stop the supply of the MS gas and PH gas into the process chamber 201. Then, according to the same processing procedure as in step 1 as described above, an unreacted gas remaining in the process chamber 201 or a gas which has contributed to the above reaction, and reaction byproducts, are excluded from the process chamber 201.

The processing conditions of the CVD film forming step will be described below.

The supply flow rate of the MS gas is set to fall within a range of, e.g., 1 to 10,000 sccm. Although appropriately determined depending on the specifications of a device formed on the wafer 200, etc., the supply flow rate of the PH gas is set to fall within a range of, e.g., 1 to 10,000 sccm. Although appropriately determined depending on the film thickness of the Si film formed on the wafer 200 and the specifications of a device, the supply time of the MS gas and PH gas may be set to fall within a range of, e.g., 1 to 2,000 minutes.

The supply flow rate of the $N_2$ gas supplied from each line is set to fall within a range of, e.g., 0 to 10,000 sccm. In one embodiment, by supplying no $N_2$ gas, it becomes possible to increase the partial pressure of each processing gas and improve the layer quality.

The internal pressure ($P_3$) in the process chamber 201 can be set to fall within a range of, e.g., 1 Pa to 2,000 Pa. However, as described above, $P_3$ may be set to be smaller than the internal pressure ($P_2$) of the process chamber 201 in step 2 of the seed step. As such, it is better to set a relationship of $P_1 > P_2 > P_3$. $P_3$ may be set to a pressure (third pressure) within a range of, e.g., 30 Pa to 200 Pa, specifically 30 Pa to 150 Pa under a second temperature to be described later.

When $P_3$ is less than 30 Pa, a gas is hardly decomposed depending on the kind of the third processing gas. Thus, homoepitaxial growth of the first Si film 200h or formation process of the second Si film 200g (hereinafter these processes are also referred to as a CVD film forming process) may hardly proceed. For example, in a case of using a DS gas or a MS gas as the third processing gas, when $P_3$ is less than 30 Pa, this gas is hardly decomposed, thereby making it difficult to progress the CVD film forming process. By setting $P_3$ to 30 Pa or more, it is possible to solve these problems.

When $P_3$ exceeds 200 Pa and reaches, e.g., about 300 Pa, an excessive vapor phase reaction occurs so that the film thickness uniformity and step coverage are likely to be deteriorated, thereby making it difficult to control them. Further, there is a possibility that particles are generated in the process chamber 201, and the film quality of the laminated film formed on the wafer 200 may be deteriorated. By setting $P_2$ to be equal to or less than 200 Pa, it is possible to solve these problems. By setting $P_3$ to be equal to or less than 150 Pa, it is possible to more reliably solve these problems.

The temperature of the heater 207 is set to a temperature at which the temperature of the wafer 200 is equal to the above-mentioned first temperature or a higher temperature (the second temperature). In one embodiment, the temperature of the heater 207 is set to a temperature such that the temperature of the wafer 200 is set to a temperature (the second temperature) within a range of, e.g., 350 to 650 degrees C., specifically 400 to 550 degrees C.

When the temperature of the wafer 200 is lower than 350 degrees C., a gas is hardly decomposed depending on the kind of the third processing gas. Thus, the above-described CVD film forming process may hardly proceed. For example, in a case of using a DS gas as the third processing gas, when the temperature of the wafer 200 is lower than 350 degrees C., the DS gas may be hardly decomposed (thermally decomposed), thereby making it difficult to progress the above-described CVD film forming process. By setting the temperature of the wafer 200 to 350 degrees C. or higher, it is possible to solve this problem. Further, by setting the temperature of the wafer 200 to 400 degrees C. or higher, it becomes easy to progress the above-described CVD film forming process. For example, in the case of using the DS gas as the third processing gas, by setting the temperature of the wafer 200 to 400 degrees C. or higher, the DS gas can be easily decomposed, thereby making it possible to reliably progress the above-described CVD film forming process. Further, in a case of using a MS gas as the third processing gas, by setting the temperature of the wafer 200 to 450 degrees C. or higher, the MS gas can be easily decomposed, thereby making it possible to reliably progress the above-described CVD film forming process.

When the temperature of the wafer 200 exceeds 650 degrees C., an excessive vapor phase reaction occurs so that the film thickness uniformity and step coverage are likely to be deteriorated, thereby making it difficult to control them. Further, there is a possibility that particles are generated in the process chamber 201, and the film quality of the laminated film formed on the wafer 200 may be deteriorated. By setting the temperature of the wafer 200 to 650 degrees C. or lower, it is possible to solve these problems. In particular, by setting the temperature of the wafer 200 to 550 degrees C. or lower, the film thickness uniformity and step coverage can be easily secured, thereby making it possible to enhance the controllability thereof.

When the temperature of the wafer 200 is set to fall within a range of 350 to 520 degrees C., the second Si film 200g has a stronger tendency to be an amorphous Si film. In addition, when the temperature of the wafer 200 is set to fall within a range of 520 to 530 degrees C., the second Si film 200g has a stronger tendency to be a mixed Si film of amorphous and poly. In addition, when the temperature of the wafer 200 is set to fall within a range of 530 to 650 degrees C., the second Si film 200g has a stronger tendency to be a poly Si film. In either case, the first Si film 200h is formed into an epitaxial Si film by epitaxial growth.

Although appropriately determined depending on the specifications of a device formed on the wafer 200, the thickness of the first Si film 200h and the thickness of the second Si film 200g, which are grown in the CVD film forming step, can be set to fall within a range of, e.g., 0.1 to 500 nm. The thickness of each of the Si films may be set to fall within a range of, e.g., 0.1 to 10 nm, specifically 0.1 to 5 nm.

As the third processing gas, in addition to the MS gas, the above-mentioned halogen element-free silicon hydride precursor gas and the above-mentioned halosilane precursor gas can be suitably used. From the viewpoint of improving the film thickness uniformity of each Si film, it is preferable to use a lower-order silicon hydride precursor gas as the third processing gas than the second processing gas. As such, by using silane precursor gases having different molecular structures (chemical structures) in the seed step and the CVD film forming step, characteristics such as film formation efficiency, film thickness uniformity, etc. of a finally formed laminated film can be achieved in a compatible manner.

As the dopant gas, in addition to the PH gas, various gases including the above-mentioned group V element and various gases including the above-mentioned group III element may be used. As the inert gas, in addition to the $N_2$ gas, various kinds of rare gases as mentioned above may be used.

(Annealing Step)

After the first Si film 200h and the second Si film 200g are formed, the temperature of the heater 207 is appropriately adjusted to subject each Si film formed on the wafer 200 to heat treatment.

This step may be performed while supplying a $N_2$ gas into the process chamber 201 or may be performed in a state in which the supply of the $N_2$ gas into the process chamber 201 is stopped. In either case, this step is performed in a state where the supply of a silane precursor gas into the process chamber 201 is stopped.

Figure 6G:
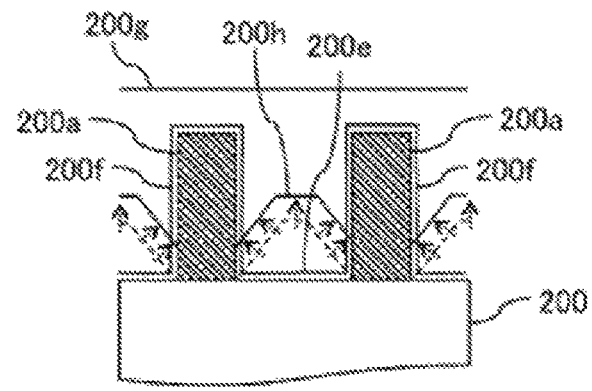
FIG. 6G is a cross-sectional structural view of the wafer surface after completion of an annealing step.

By performing the annealing step, the laminated film of the first Si film 200h and the second Si film 200g formed on the wafer 200 can be changed to a state shown in FIG. 6G. As such, a portion of the second Si film 200g (an amorphous Si film, a poly Si film or a mixed crystal Si film of amorphous and poly) which is in contact with the first Si film 200h is subjected to homoepitaxial (solid phase epitaxial growth) so as to be changed (modified) into a homoepitaxial Si film. In other words, it is possible to change the crystalline state of the portion of the second Si film 200g to the same crystalline state as that of the first Si film 200h. This homoepitaxialized region can be regarded as a part of the first Si film 200h. As such, by performing the annealing step, a region occupied by the first Si film 200h in the laminated film can be enlarged. This makes it possible to further reduce the contact resistance of the laminated film. Further, it is also possible to make the laminated film denser and to make it a film with higher HF resistance.

The supply flow rate of the $N_2$ gas supplied from each line is set to fall within a range of, e.g., 0 to 10,000 sccm.

The internal pressure of the process chamber 201 may be set to a pressure lower than the atmospheric pressure to fall within a range of, e.g., 1 to 2,000 Pa, specifically 1 to 1,000 Pa.

The temperature of the heater 207 is set to a temperature at which the temperature of the wafer 200 is equal to the above-mentioned second temperature or a higher temperature (e.g., a third temperature). Specifically, the temperature of the heater 207 is set to a temperature such that the temperature of the wafer 200 is a predetermined temperature (e.g., the third temperature) within a range of, e.g., 500 to 700 degrees C., specifically 550 to 600 degrees C. By using such processing conditions, the above-mentioned solid phase epitaxial growth can be properly performed.

As the inert gas, in addition to the $N_2$ gas, various kinds of rare gases mentioned above may be used.

(Purging and Returning to Atmospheric Pressure)

After the heat treatment is completed, a $N_2$ gas is supplied from each of the gas supply pipes 232d and 232e into the process chamber 201 and is exhausted through the exhaust pipe 231. The $N_2$ gas acts as a purge gas. Thus, the interior of the process chamber 201 is purged with the inert gas such that a gas remaining in the process chamber 201 and reaction byproducts are removed from the interior of the process chamber 201 (after purging). Thereafter, the internal atmosphere of the process chamber 201 is replaced with the inert gas (inert gas replacement), and the internal pressure of the process chamber 201 returns to the normal pressure (returning to atmospheric pressure).

(Boat Unloading and Wafer Discharging)

The seal cap 219 is descended by the boat elevator 115 such that the lower end of the reaction tube 203 is opened. Then, the processed wafers 200 supported by the boat 217 are unloaded from the lower end of the reaction tube 203 outside of the reaction tube 203 (boat unloading). The processed wafers 200 are discharged from the boat 217 (wafer discharging).

(3) Effects According to the Present Embodiment

According to the present embodiment, one or more effects set forth below may be achieved.

(a) In the seed step, by performing step 1 of supplying the DCS gas, the natural oxide film 200b formed on the surface of the single crystal Si can be removed by the treatment effect by DCS, while a dangling bond of Si can be generated on the surface of the single crystal Si. This makes it possible to grow the seed layer 200e, which is an epitaxial Si layer, on the single crystal Si. In addition, by using the epitaxial Si layer for the seed layer 200e, in the CVD film forming step, the epitaxial growth of Si on the seed layer 200e can be continued and the first Si film 200h, which is an epitaxial Si film, can be formed on the seed layer 200e.

Thus, it is possible to form a film formed by laminating the first Si film 200h and the second Si film 200g on the surface (single crystal Si) of the wafer 200, that is, a laminated film including an epitaxial Si film in a lower layer side (an interface with the surface of the wafer 200). This laminated film has lower contact resistance with the wafer 200 and better electric characteristics than a single Si film composed of amorphous Si, poly Si, or a mixed crystal Si of amorphous and poly.

(b) In the seed step, step 1 of supplying the $H_2$ gas is performed to efficiently remove residual Cl, which is generated by treatment with the DCS gas and hinders seed formation by the DS gas in step 2. Thus, seed formation can be properly performed in step 2.

(c) In the seed step, the seed layers 200e and 200f are doped with P as a dopant, thereby imparting conductivity to the seed layers 200e and 200f. Thus, it is possible to further lower the contact resistance of the laminated film including the seed layers 200e and 200f as constituent elements. As such, by doping the seed layers 200e and 200f with P, it is possible to further improve the excellent electric characteristics of the laminated film including the epitaxial Si film on the lower layer side. According to the present embodiment, by combining the two methods of forming the lower layer of the laminated film with the epitaxial Si film and doping P into the seed layer which is a part of the laminated film, it is possible to remarkably improve the electrical characteristics. This makes it possible to lower the starting voltage of a semiconductor device including the laminated film or to reduce the power consumption.

(d) By doping each of the seed layers 200e and 200f with P, it is possible to suppress diffusion of P from the first Si film 200h toward the seed layer 200e and diffusion of P from the second Si film 200g toward the seed layer 200f. Thus, it is possible to form each of the first Si film 200h and the second Si film 200g into a film having a small change in concentration of P (good density balance) in the thickness direction and maintain that state even after the film formation. Thus, it is possible to suppress an increase in contact resistance and an increase in channel resistance. In addition, it is possible to suppress fluctuation of a threshold voltage and suppress an increase in power consumption.

(e) The P concentration in each of the seed layers 200e and 200f is a concentration at which the above-mentioned effect of reducing the contact resistance, etc. is obtained. This P concentration may be lower than the P concentration in each of the first Si film 200h and the second Si film 200g. By setting the P concentration in the seed layer 200e to such a small value, it is possible to form a state in which epitaxial growth is more likely to proceed, so that the seed layer 200e formed on the wafer 200 can be more properly formed into an epitaxial Si layer. Thus, it is possible to more reliably obtain the effect of reducing the contact resistance by using the epitaxial Si layer as the lower layer side of the laminated film. Further, by setting the P concentration in each of the seed layers 200e and 200f to be small as described above, it is possible to avoid deterioration of the surface roughness of a layer or film to be formed. In addition, by setting the supply flow rate, partial pressure and concentration of the PH gas at the time of forming the seed layers 200e and 200f to be lower than the supply flow rate, partial pressure and concentration of the PH gas at the time of forming the first Si film 200h and the second Si film 200g, it is possible to create an environment in which the epitaxial growth of the seed layer 200e is more likely to proceed and it is also possible to create an environment in which deterioration of the surface roughness of a layer or film to be formed is easily suppressed.

(f) The above-described same effects can be obtained in a case of using a halosilane precursor gas other than the DCS gas, a case of using a silicon hydride precursor gas other than the DS gas, a case of using a silicon hydride source gas other than the MS gas, a case of using H-containing gas other than an $H_2$ gas and a case of using a dopant gas other than the PH gas.

(4) Modifications

The film forming sequence of the present embodiment is not limited to the above-described forms but may be modified in many different ways as follows.

Modification 1

As in Modification 1 of FIG. 5 and a film forming sequence shown below, in the seed step, the step of supplying the H₂ gas may be continuously performed before the step of supplying the DS gas is started after completion of the step of supplying the DCS gas. As such, in the seed step, the step of supplying the H₂ gas may be continuously performed at the same time of starting the step of supplying the DCS gas before the step of supplying the DS gas is started. In the following film forming sequence, the notation of PH gas supply and annealing step may be omitted for the sake of convenience.

(DCS+H₂→H₂→DS)×n→MS

This modification can obtain the same effects as the film forming sequence shown in FIG. 4. Further, according to this modification, it is possible to enhance the residual Cl removal effect more than the film forming sequence shown in FIG. 4.

Modification 2

As in Modification 2 of FIG. 5 and a film forming sequence shown below, in the seed step, the step of supplying the H₂ gas may be performed before the step of supplying the DS gas is started after the step of supplying the DCS gas is completed. In this case, the step of supplying the H₂ gas is performed non-simultaneously with the step of supplying the DCS gas and the step of supplying the DS gas.

(DCS+H₂→DS)×n→MS

This modification can obtain the same effects as the film forming sequence shown in FIG. 4.

Modification 3

The seed step may include a period in which the step of supplying the DS gas and the step of supplying the H₂ gas are performed simultaneously. For example, as in Modification 3 of FIG. 5 and a film forming sequence shown below, in the seed step, a step of simultaneously performing the step of supplying the DCS gas, the step of supplying the DS gas and the step of supplying the H₂ gas may be alternately performed.

(DCS→DS+H₂)×n→MS

According to this modification, due to the action of the H₂ gas, it is possible to suppress the reaction for forming a seed occurring in the step of supplying the DS gas and it is easy to supply a sufficient amount of DS gas to the center portion of the wafer 200 without consuming the DS gas too much on a periphery portion of the wafer 200. Further, due to the action of the H₂ gas, it is possible to improve thermal conductivity and heat the wafer 200 more uniformly. Thus, in the step of supplying the DS gas, it is possible to adsorb Si onto the wafer 200 more uniformly and improve the uniformity of in-plane thickness of each of the first seed layer and the second seed layer formed on the wafer 200. Thus, it is possible to make the finally formed Si film into a denser film with less film breakage, etc.

Modification 4

As in Modification 4 of FIG. 5 and a film forming sequence shown below, in the seed step, the step of supplying the H₂ gas in Modification 3 may be continuously performed before the next step of supplying the DCS gas is started after the step of supplying the DS gas is completed. As such, the step of supplying the H₂ gas may be started simultaneously with the step of supplying the DS gas and continuously performed before the next step of supplying the DCS gas is started.

(DCS→DS+H₂→H₂)×n→MS

This modification can obtain the same effects as Modification 3. Further, according to this modification, it is possible to enhance the reaction suppression effect and the thermal conductivity improvement effect more than those in Modification 3.

Modification 5

As in Modification 5 of FIG. 5 and a film forming sequence shown below, in the seed step, the step of supplying the H₂ gas may be performed before the next step of supplying the DCS gas is started after the step of supplying the DS gas is completed. In this case, the step of supplying the H₂ gas is performed non-simultaneously with the step of supplying the DCS gas and the step of supplying the DS gas.

(DCS→DS→H₂)×n→MS

This modification can obtain the same effects as Modification 3.

Modification 6

The seed step may include a period in which the step of supplying the DCS gas and the step of supplying the H₂ gas are performed simultaneously and a period in which the step of supplying the DS gas and the step of supplying the H₂ gas are performed simultaneously. For example, as in Modification 6 of FIG. 5 and a film forming sequence shown below, in the seed step, a step of simultaneously performing the step of supplying the DCS gas and the step of supplying the H₂ gas and a step of simultaneously performing the step of supplying the DS gas and the step of supplying the H₂ gas may be alternately performed.

(DCS+H₂→DS+H₂)×n→MS

This modification can obtain the same effects as the film forming sequence shown in FIG. 4 and the same effects as Modification 3.

Modification 7

As in Modification 7 shown in FIG. 5, in Modification 6, the supply flow rate of the H₂ gas supplied in the period in which the step of supplying the DCS gas and the step of supplying the H₂ gas are simultaneously performed, may be set to be smaller than the supply flow rate of the H₂ gas supplied in the period in which the step of supplying the DS gas and the step of supplying the H₂ gas are simultaneously performed. This modification can obtain the same effects as Modification 6 and can enhance the reaction suppression effect and the thermal conductivity improvement effect.

Modification 8

As in Modification 8 shown in FIG. 5, in Modification 6, the supply flow rate of the H₂ gas supplied in the period in which the step of supplying the DCS gas and the step of supplying the H₂ gas are simultaneously performed, may be set to be larger than the supply flow rate of the H₂ gas supplied in the period in which the step of supplying the DS gas and the step of supplying the H₂ gas are simultaneously performed. This modification can obtain the same effects as Modification 6 and can enhance the residual Cl removal effect.

Modification 9

As in Modification 9 shown in FIG. 5, in the seed step, the H₂ gas may be continuously supplied. As such, in the seed step, under a state where the step of supplying the $H_2$ gas is performed, the step of supplying the DCS gas and the step of supplying the DS gas may be alternately performed. This modification can obtain the same effects as the film forming sequence shown in FIG. 4 and the same effects as Modifications 1 to 6.

Modification 10

In the seed step of the film forming sequence shown in FIG. 4, the residual gas removal step of removing the residual gas or the like from the process chamber 201 in each of steps 1 and 2 is performed. However, this residual gas removal step may not be performed. According to this modification, it is possible to shorten a time required for the seed step, thereby improving the productivity of film formation.

Modification 11

As the first processing gas, a chlorosilane precursor gas other than the DCS gas, for example, a HCDS gas, a MCS gas, or the like, may be used. Even in this modification, by setting various processing conditions in the same manner as the processing conditions of the film forming sequence shown in FIG. 4, the same effects as the film forming sequence shown in FIG. 4 can be obtained. In addition, by using the HCDS gas, which has more Cl atoms contained in one molecule than the DCS gas, as the first processing gas, it is possible to enhance the above-mentioned treatment effect more than the film forming sequence shown in FIG. 4. In addition, by using the MCS gas, which has fewer Cl atoms contained in one molecule than the DCS gas, as the first processing gas, it is possible to reduce the Cl concentration in a film as compared with the film forming sequence shown in FIG. 4.

Modification 12

As the first processing gas, a silane precursor gas containing C, for example, a silane precursor gas having a Si—C bond, may be used. For example, as the first processing gas, a 1,1,2,2-tetrachloro-1,2-dimethyldisilane (($CH_3$)$_2Si_2Cl_4$, abbreviation: TCDMDS) gas, a bis(trichlorosilyl)methane (($SiCl_3$)$_2CH_2$, abbreviation: BTCSM) gas, etc. may be used. Even in this modification, by setting various processing conditions in the same manner as the processing conditions of the film forming sequence shown in FIG. 4, the same effects as the film forming sequence shown in FIG. 4 can be obtained. Further, according to this modification, the seed layers 200e and 200f formed in the seed step may be doped with a small amount of C.

Modification 13

As the first processing gas, a halosilane precursor gas containing a halogen group other than Cl, for example, a halosilane precursor gas containing F, Br, I, or the like, may be used. For example, a fluorosilane precursor gas such as a tetrafluorosilane ($SiF_4$) gas, etc., a bromosilane precursor gas such as a tetrabromosilane ($SiBr_4$) gas, etc., an iodosilane precursor gas such as a tetraiodosilane ($SiI_4$) gas, etc. may be used as the first processing gas. Even in this modification, by setting various processing conditions in the same manner as the processing conditions of the film forming sequence shown in FIG. 4, the same effects as the film forming sequence shown in FIG. 4 can be obtained.

Modification 14

As the first processing gas, a S-free chloro-based gas containing a chloro group may be used. Further, a Si-free halogen-based gas containing a halogen group other than Cl may be used. For example, as the first processing gas, a hydrogen chloride (HCl) gas, a chlorine ($Cl_2$) gas, a $BCl_3$ gas, or a chlorine fluoride ($ClF_3$) gas may be used. Even in this modification, by setting various processing conditions in the same manner as the processing conditions of the film forming sequence shown in FIG. 4, the same effects as the film forming sequence shown in FIG. 4 can be obtained.

Modification 15

As the second processing gas, a silane precursor gas containing C and N may be used. For example, as the second processing gas, an aminosilane precursor gas may be used. As the aminosilane precursor gas, it may be possible to use, e.g., an aminosilane precursor gas such as a butylaminosilane (BAS) gas, a bis(tert-butyl)aminosilane (BTBAS) gas, a dimethylaminosilane (DMAS) gas, a bisdimethylaminosilane (BDMAS) gas, a trisdimethylaminosilane (3DMAS) gas, a diethylaminosilane (DEAS) gas, a bisdiethylaminosilane (BDEAS) gas, a dipropylaminosilane (DPAS) gas, a diisopropylaminosilane (DIPAS) gas, etc. Even in this modification, by setting various processing conditions in the same manner as the processing conditions of the film forming sequence shown in FIG. 4, the same effects as the film forming sequence shown in FIG. 4 can be obtained. Further, according to this modification, like Modification 12, the seed layers 200e and 200f formed in the seed step may be doped with a small amount of C, or the like.

Modification 16

When the CVD film forming step is carried out, an $H_2$ gas may be supplied, together with the third processing gas, to the wafer 200. The $H_2$ gas can be supplied from any one of the gas supply pipes 232a to 232c. The supply flow rate of the $H_2$ gas can be set to fall within a range of, e.g., 1 to 10,000 sccm. Even in this modification, by setting various processing conditions in the same manner as the processing conditions of the film forming sequence shown in FIG. 4, the same effects as the film forming sequence shown in FIG. 4 can be obtained. Further, according to this modification, by flowing the $H_2$ gas together with the processing gas, it is possible to appropriately suppress adsorption of Si onto the wafer 200 in the CVD film forming step and improve the uniformity of in-plane film thickness of the finally formed Si film. In one embodiment, the $H_2$ gas may be constantly supplied at least from the start of the seed step to the end of the CVD film forming step. By constantly supplying the $H_2$ gas, it is possible to further enhance the above-mentioned effect by addition of $H_2$ gas.

Other Embodiments of the Present Disclosure

While some embodiments of the present disclosure have been specifically described above, the present disclosure is not limited to the aforementioned embodiments but may be differently modified without departing from the subject matter of the present disclosure.

For example, in the aforementioned embodiments and modifications, an example in which the annealing step is performed after forming the first Si film and the second Si film has been described. However, the annealing step may be omitted. As such, according to the methods of the aforementioned embodiments and modifications, without performing the annealing step, that is, in an as-depo state, an epitaxial Si film (the first Si film) can be formed at an interface between the single crystal Si and the second Si film, and it is not necessary to perform the annealing step to obtain this configuration (structure).

The methods of the aforementioned embodiments and modifications can be applied to a process of forming a Si film which is performed as one of processes of manufacturing a dynamic random access memory (DRAM) which is a volatile semiconductor memory device (volatile memory). Hereinafter, a structure of a main part of a DRAM manufactured by applying the methods of the aforementioned embodiments and modifications will be described with reference to FIG. 9.

Here, for the sake of convenience, a portion of a film or structure constituting the DRAM will be described, and description of other films or structures will be omitted.

Figure 9:
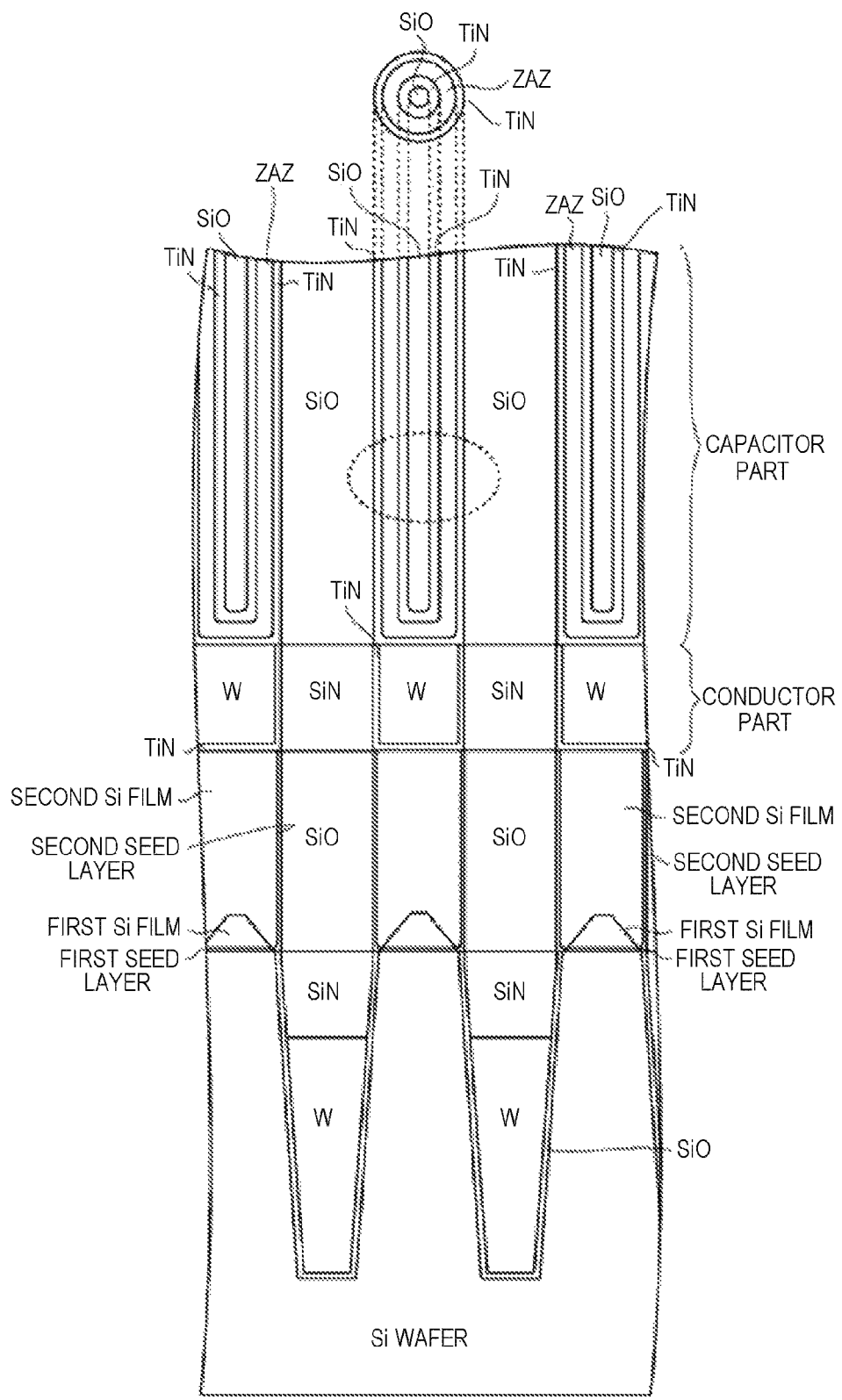
FIG. 9 is a cross-sectional structural view of a main part of a DRAM.

As shown in FIG. 9, a trench is formed in the surface of a single crystal Si wafer. A liner film such as a SiO film is formed on the surface of the trench. The SiO film can be formed by, for example, a CVD method or a thermal oxidation method. The trench with the liner film formed on its surface is filled with a tungsten (W) film for a word line and a SiN film in a stacked state. An insulating film such as a SiO film, etc. is formed on the SiN film formed in the trench.

A first seed layer composed of a homoepitaxial Si layer doped with P is formed on a portion where the surface of the wafer is exposed, that is, on the single crystal Si, and a second seed layer composed of an amorphous Si layer, a poly Si layer, or a mixed crystal Si layer of amorphous and poly, which is doped with P, is formed on the SiO film.

A first Si film composed of a homoepitaxial Si film doped with P is formed on the first seed layer on the single crystal Si, and a second Si film composed of an amorphous Si film, a poly Si film, or a mixed crystal Si film of amorphous and poly, which is doped with P, is formed on the second seed layer on the SiO film. In other words, a concave portion composed of an adjacent SiO film and single crystal Si is filled with the Si film. In addition, a laminated structure constituted by laminating the second Si film on the first Si film is formed on the single crystal Si. As such, an epitaxial Si film (the first Si film) is formed at an interface between the single crystal Si and the second Si film. The first Si film and the second Si film act as a contact plug. The first seed layer and the second seed layer may be considered to be included in a part of the contact plug.

A contact portion is formed on the SiO film and the second Si film, and a capacitor portion is formed on the contact portion. A laminated structure including the capacitor portion and the contact portion is shown in a longitudinal sectional view in the lower part of FIG. 9, and a portion indicated by a broken line in the capacitor portion is shown in a cross-sectional view in the upper part of FIG. 9. In forming the contact plug of the DRAM having such a structure, that is, the first seed layer, the second seed layer, the first Si film and the second Si film, the methods of the aforementioned embodiments and modifications are used to obtain the same effects as the aforementioned embodiments and modifications. As such, even when the methods of the aforementioned embodiments and modifications are applied to the process of manufacturing the DRAM, it is possible to significantly reduce the contact resistance and significantly improve the electrical characteristics.

The aforementioned embodiments and modifications can be applied to a process of forming a Si film which is performed as one of processes of manufacturing a flash memory which is a nonvolatile semiconductor memory device (nonvolatile memory). Hereinafter, a structure of a main part of a NAND type flash memory, which is one type of a flash memory manufactured by applying the methods of the aforementioned embodiments and modifications, in particular, a three-dimensional NAND type flash memory (hereinafter also referred to as a 3D NAND), will be described with reference to FIG. 10. The three-dimensional NAND type flash memory may be simply referred to as a three-dimensional flash memory (three-dimensional nonvolatile semiconductor memory device).

Here, for the sake of convenience, a portion of a film or structure constituting the 3D NAND will be described and description of other films or structures will be omitted.

Figure 10:
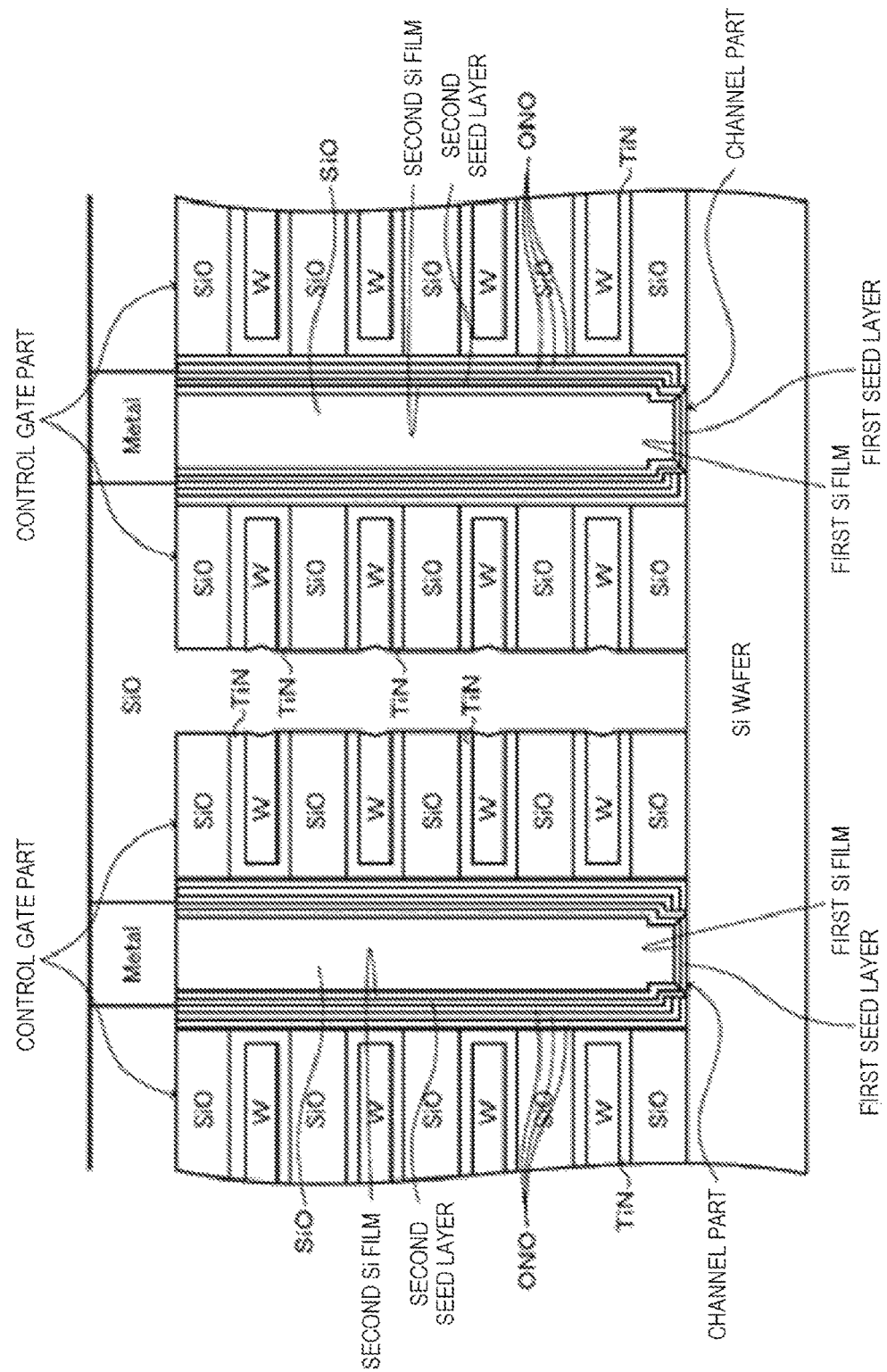
FIG. 10 is a cross-sectional structural view of a main part of a 3D NAND.

As shown in FIG. 10, a multi-layered laminated film (hereinafter referred simply to as a "laminated film") constituted by alternately stacking a plurality of SiO films and metal films such as TiN films, W films, etc. is formed on the surface of a wafer made of single crystal Si. An example in which the lowermost layer and the uppermost layer are SiO films is shown here. Each of the metal films such as TiN films and W films acts as a control gate. As such, each of the metal films such as the TiN films, the W films, etc., acting as a control gate, is formed between vertically adjacent SiO films. An example in which the number of stacked layers is 9 is shown in FIG. 10 for the sake of convenience, but the present disclosure is not limited to such a configuration. For example, the number of stacked layers may be 20 or more, 30 or more, further 40 or more.

A channel hole is formed in the laminated film, and an ONO film, that is, an insulating film composed of three layers of SiO film/SiN film/SiO film, is formed in the channel hole.

Some of a contact portion of the ONO film with the wafer remains removed. A first seed layer composed of a homoepitaxial Si layer doped with P is formed on a portion where the surface of the wafer in the channel hole is exposed, that is, on the single crystal Si, and a second seed layer composed of an amorphous Si layer, a poly Si layer, or a mixed crystal Si layer of amorphous and poly, which is doped with P, is formed on the ONO film (exactly on the SiO film constituting the ONO film).

A first Si film composed of a homoepitaxial Si film doped with P is formed on the first seed layer on the single crystal Si, and a second Si film composed of an amorphous Si film, a poly Si film, or a mixed crystal Si film of amorphous and poly, which is doped with P, is formed on the second seed layer on the ONO film. The film thickness of each of the first Si film and the second Si film may be 10 nm or less, for example 3 to 10 nm, further 5 nm or less, for example 3 to 5 nm. Each of the first Si film and the second Si film acts as a channel. Each of the Si films (the first Si film and the second Si film) acting as this channel is also referred to as channel Si. In one embodiment, the first seed layer and the second seed layer may be considered to be included in a part of the channel.

The remaining portion in the channel hole, that is, the concave portion constituted by the first Si film and the second Si film, is filled with the SiO film. A channel part is constituted in this way.

A trench is formed in the multi-layered laminated film constituted by alternately stacking the plurality of SiO films and metal films such as TiN films, W films, etc. The trench is filled with the SiO film.

The SiO film is also formed on the upper portion of the control gate part and the upper portion of the channel part. A contact hole is formed above the channel part of the SiO film, and a metal film serving as a contact is formed in the contact hole.

In forming the channel Si of 3D NAND having such a structure, that is, the first seed layer, the second seed layer, the first Si film and the second Si film, the methods of the aforementioned embodiments and modifications are used to obtain the same effects as the methods of the aforementioned embodiments and modifications. As such, even when the methods of the aforementioned embodiments and modifications are applied to the process of manufacturing the 3D NAND, it is possible to significantly reduce the contact resistance between the Si wafer and the channel Si and significantly improve the electrical characteristics.

Further, by applying the methods of the aforementioned embodiments and modifications to the 3D NAND manufacturing process, it is possible to form a flat and dense seed layer (the first seed layer and the second seed layer) and a thin, flat and dense Si film (the first Si film and the second Si film), thereby allowing the Si film to be a film without pinholes (pinhole-free film). Thus, this makes it possible to prevent an underlying film of the Si film from being etched by a wet-etching process using HF, etc., which is performed after the Si film is formed. In addition, since it is possible to form a thin, flat and dense Si film, it is possible to reduce the thickness of the second Si film, thereby reducing the trap density of charges at a crystal grain boundary and increasing the mobility of electrons in the channel of the 3D NAND.

A plurality of recipes used for substrate processing may be individually prepared according to the contents of substrate processing and may be stored in the memory device 121c via an electrical communication line or the external memory device 123. Then, when the substrate processing is initiated, the CPU 121a may appropriately select an appropriate recipe from the plurality of recipes stored in the memory device 121c according to the substrate processing contents. With this configuration, films having a variety of film types, composition ratios, film qualities, and film thicknesses can be formed with high reproducibility in a single substrate processing apparatus. In addition, it is possible to reduce an operator's burden and to quickly start the substrate processing while avoiding an operation error.

The recipes mentioned above are not limited to newly-prepared ones but may be prepared by, for example, altering the existing recipes already installed in the substrate processing apparatus. When altering the recipes, the altered recipes may be installed in the substrate processing apparatus via a telecommunication line or a recording medium storing the recipes. In addition, the existing recipes already installed in the substrate processing apparatus may be directly altered by operating the input/output device 122 of the substrate processing apparatus.

In the aforementioned embodiments, there has been described an example in which films are formed using a batch-type substrate processing apparatus capable of processing a plurality of substrates at a time. The present disclosure is not limited to the aforementioned embodiments but may be appropriately applied to, e.g., a case where films are formed using a single-wafer-type substrate processing apparatus capable of processing a single substrate or several substrates at a time. In addition, in the aforementioned embodiments, there has been described an example in which films are formed using a substrate processing apparatus provided with a hot-wall-type processing furnace. The present disclosure is not limited to the aforementioned embodiments but may be appropriately applied to a case where films are formed using a substrate processing apparatus provided with a cold-wall-type processing furnace.

Figure 7:
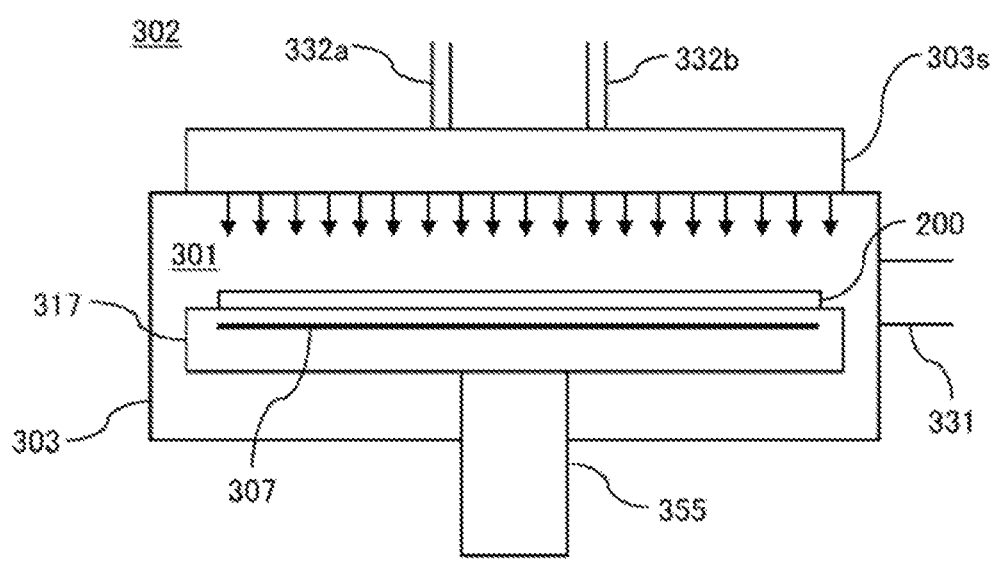
FIG. 7 is a schematic configuration view of a processing furnace of a substrate processing apparatus suitably used in another embodiment of the present disclosure, in which a portion of the processing furnace is shown in a vertical cross section.

The present disclosure may be suitably applied to, e.g., a case where a film is formed using a substrate processing apparatus provided with a processing furnace 302 as shown in FIG. 7. The processing furnace 302 includes a process vessel 303 which defines a process chamber 301, a shower head 303s as a gas supply part configured to supply a gas into the process chamber 301 in a shower-like manner, a support table 317 configured to horizontally support one or more wafers 200, a rotary shaft 355 configured to support the support table 317 from below, and a heater 307 installed in the support table 317. Gas supply ports 332a and 332b are connected to inlets of the shower head 303s. A supply system similar to the first and fifth supply systems of the aforementioned embodiments is connected to the gas supply port 332a. A supply system similar to the second to fourth supply systems of the aforementioned embodiments is connected to the gas supply port 332b. A gas distribution plate is installed in outlets of the shower head 303s. The shower head 303s is installed at such a position as to face the surfaces of the wafers 200 loaded into the process chamber 301. An exhaust port 331 configured to exhaust the interior of the process chamber 301 is installed in the process vessel 303. An exhaust system similar to the exhaust system of the aforementioned embodiments is connected to the exhaust port 331.

Figure 8:
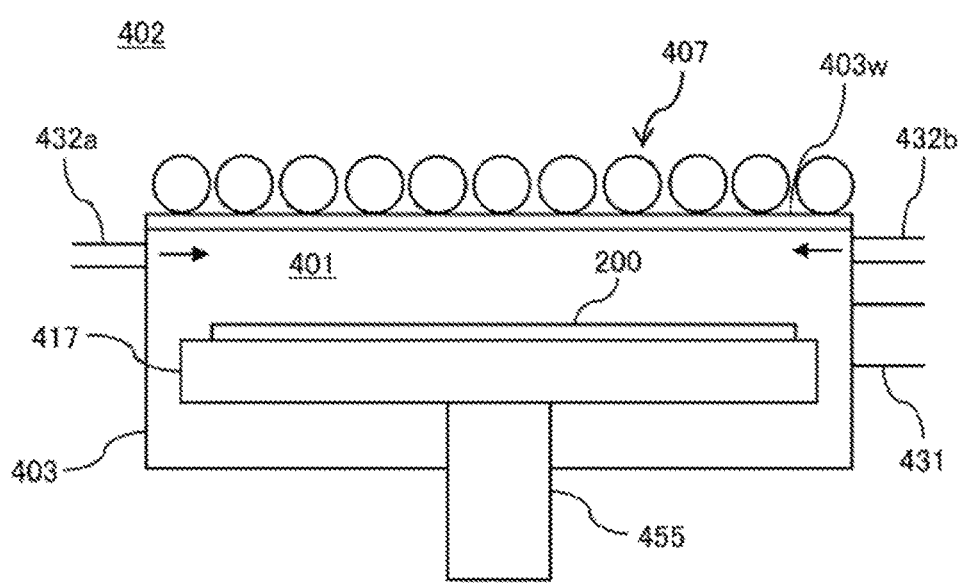
FIG. 8 is a schematic configuration view of a processing furnace of a substrate processing apparatus suitably used in a further embodiment of the present disclosure, in which a portion of the processing furnace is shown in a vertical cross section.

In addition, the present disclosure may be suitably applied to, e.g., a case where a film is formed using a substrate processing apparatus provided with a processing furnace 402 as shown in FIG. 8. The processing furnace 402 includes a process vessel 403 which defines a process chamber 401, a support table 417 configured to horizontally support one or more wafers 200, a rotary shaft 455 configured to support the support table 417 from below, a lamp heater 407 configured to irradiate light toward the wafers 200 disposed in the process vessel 403, and a quartz window 403w which transmits the light irradiated from the lamp heater 407. Gas supply ports 432a and 432b are connected to the process vessel 403. A supply system similar to the first and fifth supply systems of the aforementioned embodiments is connected to the gas supply port 432a. A supply system similar to the second to fourth supply systems of the aforementioned embodiments is connected to the gas supply port 432b. The gas supply ports 432a and 432b are respectively installed at the lateral side of the end portions of the wafers 200 loaded into the process chamber 401. An exhaust port 431 configured to exhaust the interior of the process chamber 401 is installed in the process vessel 403. An exhaust system similar to the exhaust system of the aforementioned embodiments is connected to the exhaust port 431.

Even in the case of using these substrate processing apparatuses, film formation may be performed according to the same processing procedures and processing conditions as those in the aforementioned embodiments and modifications and the same effects as the aforementioned embodiments and modifications can be obtained.

In the aforementioned embodiments and modifications, an example of forming a film containing Si as a main element on a substrate has been described, but the present disclosure is not limited thereto. As such, the present disclosure may be suitably applied to a case where a film containing a semimetal element such as germanium (Ge), B, etc. as a main element, in addition to Si, is formed on a substrate. The present disclosure may be also suitably applied to a case where a film containing a metal element such as titanium (Ti), zirconium (Zr), hafnium (Hf), niobium (Nb), tantalum (Ta), molybdenum (Mo), tungsten (W), yttrium (Y), lanthanum (La), strontium (Sr), aluminum (Al), etc. as a main element is formed on a substrate.

The aforementioned embodiments and modifications may be used in proper combination. In addition, the processing conditions used at this time may be the same as those of the aforementioned embodiments.

According to the present disclosure in some embodiments, it is possible to improve the film quality of a film formed on a substrate.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising:
   forming a seed layer on a substrate by performing a cycle one or more times, the cycle including:
      supplying a halogen-based first processing gas to the substrate;
      supplying a non-halogen-based second processing gas to the substrate; and
      supplying a hydrogen-containing gas to the substrate; and
   forming a film on the seed layer by supplying a third processing gas to the substrate.

2. The method of claim 1, wherein the act of forming the seed layer includes a period in which the act of supplying the halogen-based first processing gas and the act of supplying the hydrogen-containing gas are simultaneously performed.

3. The method of claim 1, wherein the act of forming the seed layer further includes exhausting the halogen-based first processing gas from a space where the substrate exists, and
   wherein the act of forming the seed layer includes a period in which the act of exhausting the halogen-based first processing gas and the act of supplying the hydrogen-containing gas are simultaneously performed.

4. The method of claim 2, wherein the act of forming the seed layer further includes exhausting the halogen-based first processing gas from a space where the substrate exists, and
   wherein the act of forming the seed layer further includes a period in which the act of exhausting the halogen-based first processing gas and the act of supplying the hydrogen-containing gas are simultaneously performed.

5. The method of claim 1, wherein the act of forming the seed layer includes a period in which the act of supplying the non-halogen-based second processing gas and the act of supplying the hydrogen-containing gas are simultaneously performed.

6. The method of claim 1, wherein the act of forming the seed layer further includes exhausting the non-halogen-based second processing gas from a space where the substrate exists, and
   wherein the act of forming the seed layer includes a period in which the act of exhausting the non-halogen-based second processing gas and the act of supplying the hydrogen-containing gas are simultaneously performed.

7. The method of claim 5, wherein the act of forming the seed layer further includes exhausting the non-halogen-based second processing gas from a space where the substrate exists, and
   wherein the act of forming the seed layer further includes a period in which the act of exhausting the non-halogen-based second processing gas and the act of supplying the hydrogen-containing gas are simultaneously performed.

8. The method of claim 1, wherein the act of forming the seed layer includes a period in which the act of supplying the halogen-based first processing gas and the act of supplying the hydrogen-containing gas are simultaneously performed and a period in which the act of supplying the non-halogen-based second processing gas and the act of supplying the hydrogen-containing gas are simultaneously performed.

9. The method of claim 8, wherein the act of forming the seed layer further includes:
   exhausting the halogen-based first processing gas from a space where the substrate exists; and
   exhausting the non-halogen-based second processing gas from the space where the substrate exists, and
   wherein the act of forming the seed layer further includes:
   a period in which the act of exhausting the halogen-based first processing gas and the act of supplying the hydrogen-containing gas are simultaneously performed; and
   a period in which the act of exhausting the non-halogen-based second processing gas and the act of supplying the hydrogen-containing gas are simultaneously performed.

10. The method of claim 8, wherein a supply flow rate of the hydrogen-containing gas simultaneously supplied with the halogen-based first processing gas is set to be smaller than a supply flow rate of the hydrogen-containing gas simultaneously supplied with the non-halogen-based second processing gas.

11. The method of claim 8, wherein a supply flow rate of the hydrogen-containing gas simultaneously supplied with the halogen-based first processing gas is set to be larger than a supply flow rate of the hydrogen-containing gas simultaneously supplied with the non-halogen-based second processing gas.

12. The method of claim 1, wherein the act of forming the seed layer includes a period in which the act of supplying the halogen-based first processing gas and the act of supplying the non-halogen-based second processing gas are alternately performed under a state where the act of supplying the hydrogen-containing gas is performed.

13. A substrate processing apparatus comprising:
   a process chamber configured to accommodate a substrate;
   a first supply system configured to supply a halogen-based first processing gas to the substrate in the process chamber;
   a second supply system configured to supply a non-halogen-based second processing gas to the substrate in the process chamber;

a third supply system configured to supply a third processing gas to the substrate in the process chamber;

a fourth supply system configured to supply a hydrogen-containing gas to the substrate in the process chamber; and a control part configured to control the first supply system, the second supply system, the third supply system, and the fourth supply system to perform:

forming a seed layer on the substrate in the process chamber by performing a cycle one or more times, the cycle including supplying the halogen-based first processing gas to the substrate, supplying the non-halogen-based second processing gas to the substrate, and supplying the hydrogen-containing gas to the substrate; and forming a film on the seed layer by supplying the third processing gas to the substrate.

14. A non-transitory computer-readable recording medium storing a program that causes a computer to perform, on a substrate processing apparatus, a process in a process chamber of the substrate processing apparatus, the process comprising:

forming a seed layer on a substrate by performing a cycle one or more times, the cycle including:

supplying a halogen-based first processing gas to the substrate;

supplying a non-halogen-based second processing gas to the substrate; and supplying a hydrogen-containing gas to the substrate to remove a halogen material, which remains after the act of supplying the halogen-based first processing gas, from the process chamber; and forming a film on the seed layer by supplying a third processing gas to the substrate.

* * * * *